(12) United States Patent
Kim et al.

(10) Patent No.: US 12,740,485 B2
(45) Date of Patent: Sep. 15, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Hyoeun Kim, Suwon-si (KR); Dohyun Kim, Suwon-si (KR); Sunkyoung Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 520 days.

(21) Appl. No.: 18/359,031

(22) Filed: Jul. 26, 2023

(65) Prior Publication Data

US 2024/0128236 A1 Apr. 18, 2024

(30) Foreign Application Priority Data

Oct. 18, 2022 (KR) ........................ 10-2022-0133852

(51) Int. Cl.
*H01L 21/66* (2006.01)
*H10P 74/00* (2026.01)
(Continued)

(52) U.S. Cl.
CPC ........... *H10W 90/00* (2026.01); *H10P 74/273* (2026.01); *H10W 72/923* (2026.01); (Continued)

(58) Field of Classification Search
CPC ........... H01L 22/32; H01L 2224/05073; H01L 2224/05124; H01L 2224/05147; H01L 2224/0603; H01L 2224/08059; H01L 2224/08145; H01L 2224/09055; H01L 2224/09515; H01L 2224/16227; H01L 2224/32225; H01L 2224/73204;
(Continued)

(56) References Cited

U.S. PATENT DOCUMENTS 9,653,430 B2 5/2017 Kim et al.
10,886,245 B2 1/2021 Chen et al.
(Continued)

FOREIGN PATENT DOCUMENTS

KR 10-2021-0070176 A 6/2021
KR 10-2022-0081036 A 6/2022

*Primary Examiner* — Jaehwan Oh

(74) *Attorney, Agent, or Firm* — Wolf, Greenfield & Sacks, P.C.

(57) ABSTRACT

A semiconductor package includes a first semiconductor chip and a second semiconductor chip on the first semiconductor chip. The first semiconductor chip includes a first wiring layer on a first substrate, and a first passivation layer on the first wiring layer and that exposes at least portions of first bonding pads and a first test pad that are on the second wiring layer. The second semiconductor chip includes a second wiring layer on a second substrate and a second passivation layer on the second wiring layer and that exposes at least portions of third bonding pads and second test pad that are provided on the second wiring layer. The first bonding pads and respective ones of the third bonding pads are directly bonded to each other. The first passivation layer and the second passivation layer are directly bonded to each other.

20 Claims, 34 Drawing Sheets

10

(51) Int. Cl.

| | |
|---|---|
| ***H10W 90/00*** | (2026.01) |
| *H10W 72/90* | (2026.01) |
| *H10W 74/15* | (2026.01) |
| *H10W 80/00* | (2026.01) |
| *H10W 90/20* | (2026.01) |

(52) U.S. Cl.

CPC ........ *H10W 72/926* (2026.01); *H10W 72/934* (2026.01); *H10W 72/936* (2026.01); *H10W 72/952* (2026.01); *H10W 72/967* (2026.01); *H10W 74/15* (2026.01); *H10W 80/312* (2026.01); *H10W 80/327* (2026.01); *H10W 80/334* (2026.01); *H10W 80/732* (2026.01); *H10W 90/297* (2026.01); *H10W 90/724* (2026.01); *H10W 90/734* (2026.01); *H10W 90/792* (2026.01)

(58) Field of Classification Search

CPC . H01L 2224/80203; H01L 2224/80895; H01L 2224/80896; H01L 2225/06517; H01L 2225/06524; H01L 2225/06541; H01L 24/03; H01L 24/05; H01L 24/06; H01L 24/08; H01L 24/09; H01L 24/16; H01L 24/32; H01L 24/73; H01L 24/80; H01L 25/0657; H01L 25/18; H01L 25/50; H01L 2924/37001

See application file for complete search history.

(56) References Cited

U.S. PATENT DOCUMENTS

| | | | | |
|---|---|---|---|---|
| 10,998,293 | B2 | 5/2021 | Chen et al. | |
| 11,088,038 | B2 | 8/2021 | Lee et al. | |
| 11,289,438 | B2 | 3/2022 | Hong et al. | |
| 11,355,404 | B2 | 6/2022 | Gao et al. | |
| 2019/0363068 | A1* | 11/2019 | Hotta | H10W 90/00 |
| 2020/0135594 | A1* | 4/2020 | Lee | G01R 31/2884 |
| 2021/0366851 | A1 | 11/2021 | Bourjot et al. | |
| 2022/0028748 | A1 | 1/2022 | Liu et al. | |
| 2023/0060208 | A1* | 3/2023 | Chang | H10P 74/273 |
| 2024/0038718 | A1* | 2/2024 | Hung | H10W 90/00 |
| 2024/0079392 | A1* | 3/2024 | Wang | H10W 90/00 |

* cited by examiner

Figure 25:
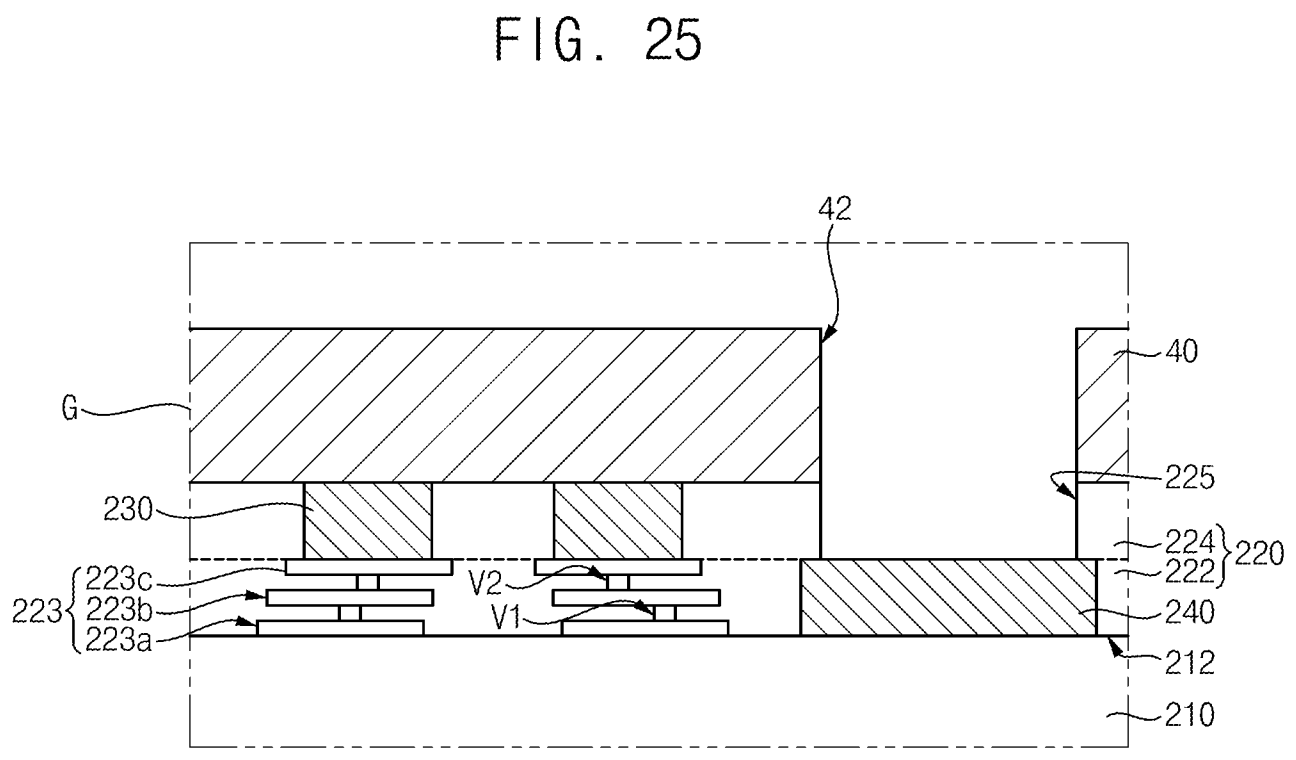

Figure 26:
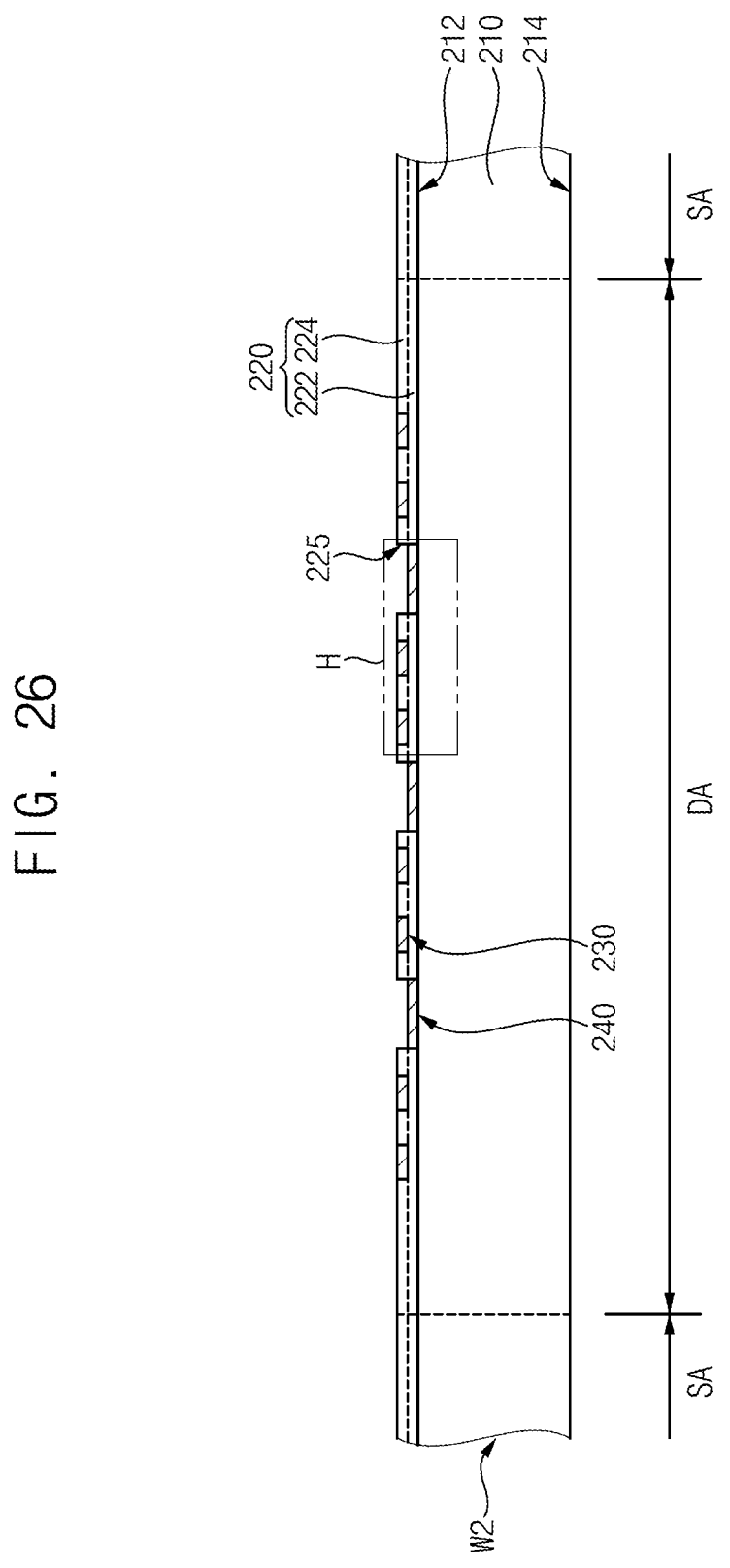

Figure 30:
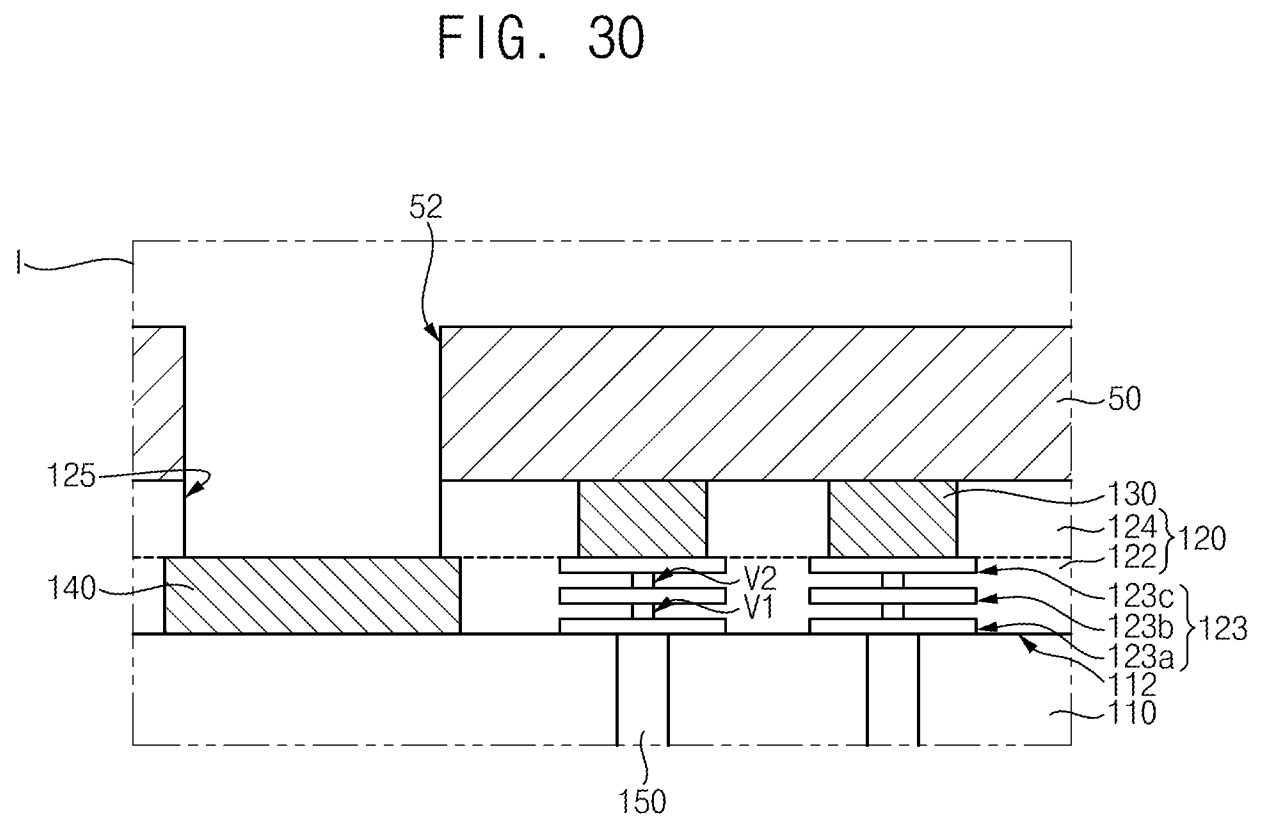

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0133852, filed on Oct. 18, 2022 in the Korean Intellectual Property Office (KIPO), the contents of which are herein incorporated by reference in their entirety.

BACKGROUND

Example embodiments relate to a semiconductor package and a method of manufacturing the semiconductor package. More particularly, example embodiments relate to a multi-chip package including a plurality of different stacked chips and a method of manufacturing the same.

In manufacturing of a multi-chip package having a hybrid bonding structure in which two semiconductor chips are stacked, an inspection process such as an electrical die sorting (EDS) process is performed on a wafer on which test pads are formed to check the yield of the fab process. However, since after the inspection process, the fab-out wafer is loaded again into the fab process chamber and processes of forming a passivation layer and bonding pads on the test pads are performed, in terms of supply chain management (SCM), there is a problem in that the processes becomes complicated and time-consuming. Further, since the test pad is formed to have a relatively large area and thickness, surface flatness between areas around the test pad may be degraded.

SUMMARY

Example embodiments provide a semiconductor package having improved bonding quality and capable of simplifying a package manufacturing process.

Example embodiments provide a method of manufacturing the semiconductor package.

According to example embodiments, a semiconductor package includes a first semiconductor chip and a second semiconductor chip on the first semiconductor chip. The first semiconductor chip includes a first substrate, a plurality of through electrodes that penetrate the first substrate, a first wiring layer on a front side surface of the first substrate, first bonding pads on the first wiring layer and electrically connected to respective ones of the plurality of through electrodes, a first test pad on the first wiring layer, and a first passivation layer on the first wiring layer and that exposes at least portions of the first bonding pads and the first test pad. The second semiconductor chip includes a second substrate, a second wiring layer on a front side surface of the second substrate, third bonding pads on the second wiring layer, a second test pad on the second wiring layer, and a second passivation layer on the second wiring layer and that exposes at least portions of the third bonding pads and the second test pad. The first bonding pads and the third bonding pads are directly bonded to each other. The first passivation layer and the second passivation layer are directly bonded to each other.

According to example embodiments, a semiconductor package includes a first semiconductor chip including a first substrate having a first surface and a second surface opposite to the first surface, a plurality of through electrodes that penetrate the first substrate, first bonding pads on the first surface of the first substrate and electrically connected to respective ones of the plurality of through electrodes, a first test pad on the first surface of the first substrate, and a first passivation layer on the first surface of the first substrate and that exposes at least portions of the first bonding pads and the first test pad. The semiconductor package includes a second semiconductor chip on the first surface of the first semiconductor chip, the second semiconductor chip including a second substrate having a third surface and a fourth surface opposite to the third surface, third bonding pads on the third surface of the second substrate, a second test pad on the third surface of the second substrate, and a second passivation layer on the third surface of the second substrate and that exposes at least portions of the third bonding pads and the second test pad. The first bonding pads and respective ones of the third bonding pads are directly bonded to each other. The first passivation layer and the second passivation layer are directly bonded to each other. The first and second test pads have a first diameter, and the first and third bonding pads have a second diameter that is smaller than the first diameter.

According to example embodiments, a semiconductor package includes a package substrate, a first semiconductor chip including a first substrate having a first surface and a second surface opposite to the first surface, a plurality of through electrodes that penetrate the first substrate, first bonding pads on the first surface of the first substrate and electrically connected to respective ones of the plurality of through electrodes, second bonding pads on the second surface and electrically connected to respective ones of the plurality of through electrodes, a first test pad on the first surface of the first substrate, and a first passivation layer on the first surface of the first substrate and that exposes at least portions of the first bonding pads and the first test pad. The first semiconductor chip is on the package substrate with conductive bumps therebetween that are on the second bonding pads. the semiconductor package includes a second semiconductor chip including a second substrate having a third surface and a fourth surface opposite to the third surface, third bonding pads on the third surface of the second substrate, a second test pad on the third surface of the second substrate and a second passivation layer on the third surface of the second substrate and that exposes at least portions of the third bonding pads and the second test pad. The second semiconductor chip is on the first semiconductor chip such that the third surface of the second semiconductor chip faces the first surface of the first semiconductor chip. The first bonding pads and respective ones of the third bonding pads are directly bonded to each other. The first passivation layer and the second passivation layer are directly bonded to each other.

According to example embodiments, in a method of manufacturing a semiconductor package, a second semiconductor chip including a second substrate, a second wiring layer on a front side surface of the second substrate, third bonding pads on the second wiring layer, a second test pad on the second wiring layer, and a second passivation layer on the second wiring layer and that exposes at least portions of the third bonding pads and the second test pad is formed. A first semiconductor chip including a first substrate, a plurality of through electrodes that penetrate the first substrate, a first wiring layer on a front side surface of the first substrate, first bonding pads on the first wiring layer and electrically connected to the through electrodes, a first test pad on the first wiring layer, and a first passivation layer on the first wiring layer and exposing at least portions of the first bonding pads and the first test pad is formed. An inspection process is performed on the first semiconductor chip using the first test pads. An inspection process is performed on the second semiconductor chip using the second test pads. A hybrid bonding process is performed to stack the second semiconductor chip on the first semiconductor chip.

According to example embodiments, a semiconductor package may include a first semiconductor chip having a first front insulating layer with first bonding pads therein and a second semiconductor chip having a second front insulating layer with third bonding pads therein. A first passivation layer of the first front insulating layer and a second passivation layer of the second front insulating layer may be directly bonded to each other. The first bonding pad of the first semiconductor chip and the third bonding pad of the second semiconductor chip may be bonded to each other by copper-copper hybrid bonding (Cu—Cu hybrid bonding).

The first passivation layer may expose at least portions of the first bonding pads and first test pads on a front side surface of a first substrate of the first semiconductor chip. The second passivation layer may expose at least portions of the third bonding pads and second test pads on a front side surface of a second substrate of the second semiconductor chip.

Accordingly, after performing an inspection process such as an electrical die sorting (EDS) process using the first and second test pads, since there is no need to perform processes of forming a passivation layer and bonding pads on the test pads, the manufacturing processes may be simplified.

Further, during the hybrid bonding process of the first and second semiconductor chips, at least a portion of the first test pad and at least a portion of the second test pad may be directly bonded to each other. Accordingly, surface flatness in peripheral regions between the first and second test pads may be increased to improve bonding quality in the hybrid bonding process.

BRIEF DESCRIPTION OF THE DRAWINGS

Example embodiments will be more clearly understood from the following detailed description taken in conjunction with the accompanying drawings. FIGS. 1 to 34 represent non-limiting, example embodiments as described herein.

FIG. 1 is a cross-sectional view illustrating a semiconductor package in accordance with example embodiments.

FIG. 2 is an enlarged cross-sectional view illustrating portion 'A' in FIG. 1.

FIG. 3 is an enlarged plan view illustrating first bonding pads and a first test pad in a first semiconductor chip in portion 'A' of FIG. 1.

FIGS. 4 to 20 are views illustrating a method of manufacturing a semiconductor package in accordance with example embodiments.

FIG. 21 is a cross-sectional view illustrating a semiconductor package in accordance with example embodiments.

FIG. 22 is an enlarged cross-sectional view illustrating portion 'F' in FIG. 21.

FIGS. 23 to 34 are views illustrating a method of manufacturing a semiconductor package in accordance with example embodiments.

DETAILED DESCRIPTION

Hereinafter, example embodiments will be explained in detail with reference to the accompanying drawings.

Figure 1:
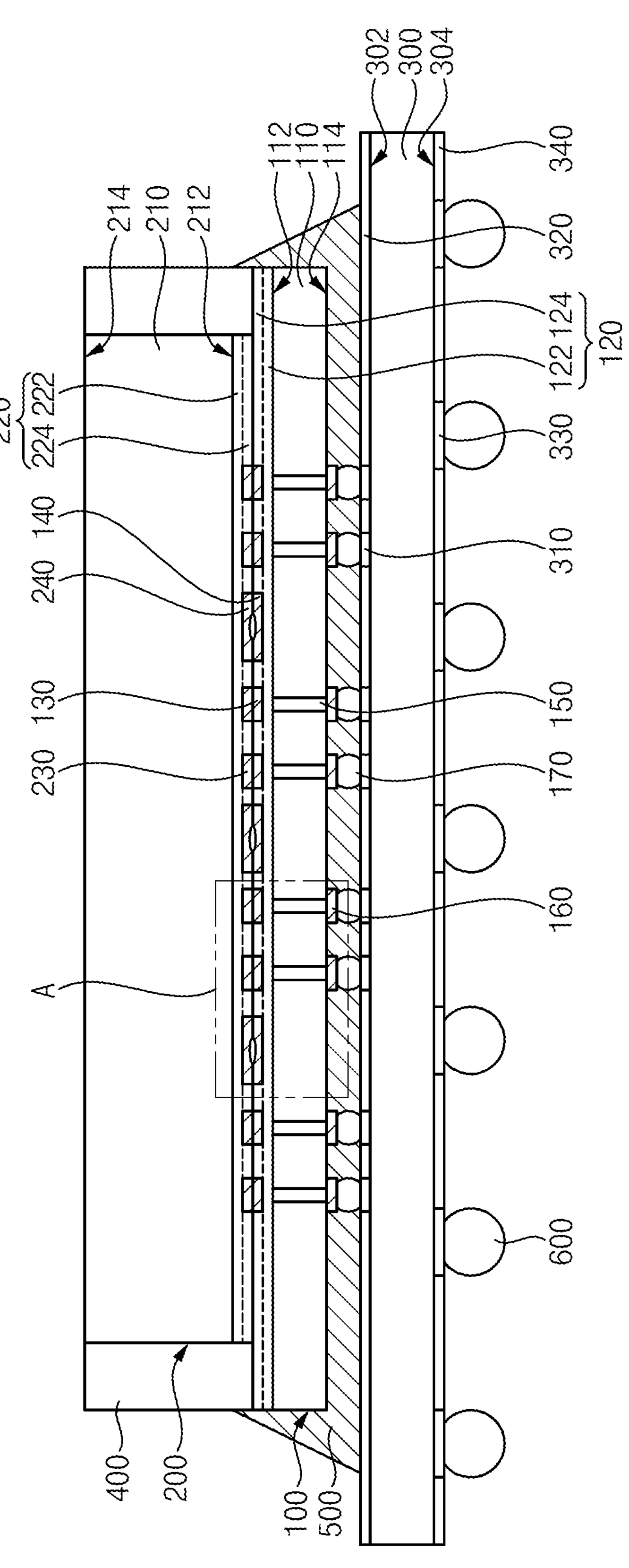
Figure 2:
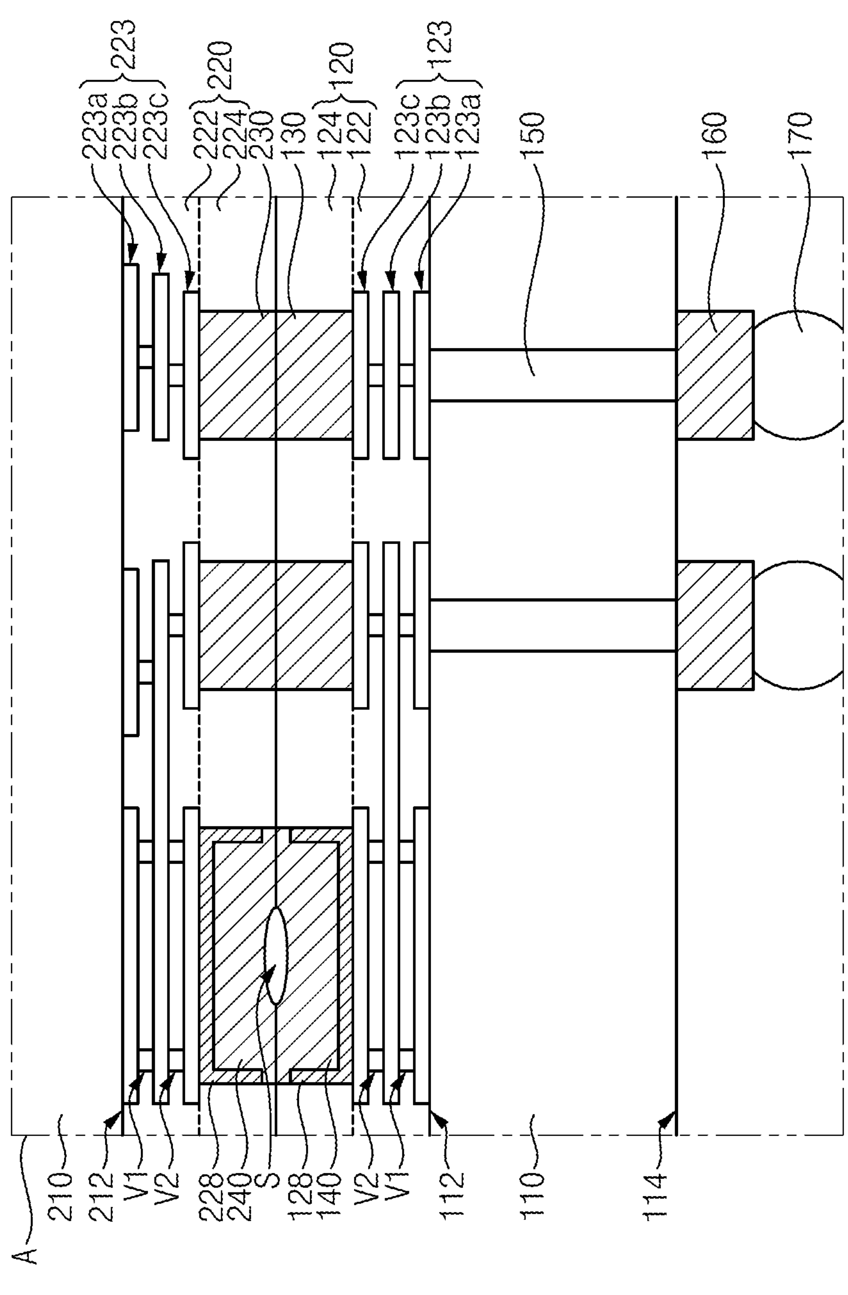
Figure 3:
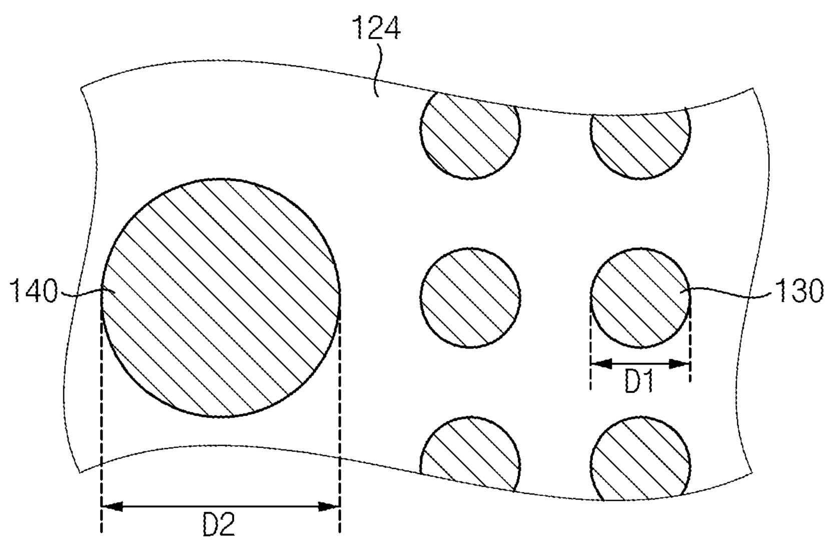

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged plan view illustrating first bonding pads and a first test pad in a first semiconductor chip in portion 'A' of FIG. 1. FIG. 1 is a cross-sectional view taken along the line A-A' in FIG. 2.

Referring to FIGS. 1 to 3, a semiconductor package 10 may include a first semiconductor chip 100 and a second semiconductor chip 200 stacked on the first semiconductor chip 100. In addition, the semiconductor package 10 may include a sealing member 400, a package substrate 300 on which the stacked first and second semiconductor chips 100 and 200 are mounted, and external connection members 600 provided on a lower surface of the package substrate 300.

In addition, the semiconductor package 10 may be a multi-chip package (MCP) including different types of semiconductor chips. The semiconductor package 10 may be a system in package (SIP) including a plurality of semiconductor chips stacked or arranged in one package to perform all or most of the functions of an electronic system.

The semiconductor package 10 may include the first semiconductor chip 100 as a logic chip and the second semiconductor chips 200 as a memory chip, sequentially stacked. The first semiconductor chip 100 may be a logic chip including a logic circuit. The logic chip may be a controller that controls memory devices of the second semiconductor chip. The first semiconductor chip may be a processor chip such as an ASIC, an application processor (AP), etc. serving as a host such as a CPU, GPU, or SOC. The second semiconductor chip may include DRAM, SRAM, etc.

In this embodiment, the semiconductor package as a multi-chip package is illustrated as including two stacked first and second semiconductor chips 100 and 200. However, it is not limited thereto, and for example, the semiconductor package may include 4, 8, 12, or 16 stacked semiconductor chips.

In example embodiments, the first semiconductor chip 100 may include a first substrate 110, a first front insulating layer 120, a plurality of first bonding pads 130, a plurality of first test pads 140, a plurality of through electrodes 150 and a plurality of second bonding pads 160.

In particular, the first substrate 110 may have a first surface 112 and a second surface 114 opposite to the first surface 112. The first surface 112 may be an active surface, and the second surface 114 may be an inactive surface. Circuit patterns may be provided on the first surface 112 of the first substrate 110. The first surface 112 may be referred to as a front side surface on which the circuit patterns are formed, and the second surface 114 may be referred to as a backside surface.

In example embodiments, the first semiconductor chip 100 may include the first front insulating layer 120 having the first bonding pads 130 on an outer surface thereof. The first front insulating layer 120 may be formed on the first surface 112 of the first substrate 110, that is, the front side surface. The first front insulating layer 120 may include a first wiring layer 122 and a first passivation layer 124. In addition, the first bonding pads 130 may be provided in an outermost insulating layer of the first front insulating layer 120.

The first wiring layer 122 may include a plurality of buffer layers and insulating layers alternately formed with each other. For example, the buffer layer may include silicon nitride, silicon carbon nitride, carbon- and nitride-doped silicon oxide (SiCON), etc. The insulating layer may include silicon oxide, carbon-doped silicon oxide, silicon carbon nitride (SiCN), etc.

The first wiring layer 122 may include a plurality of wirings 123 therein. For example, the first wiring layer 122 may include a metal wiring structure including a plurality of the wirings 123 that are vertically stacked in the buffer layers and in the insulating layers of the first wiring layer 122. A plurality of the wirings may include a first metal wiring 123*a*, a first via V1, a second metal wiring 123*b*, a second via V2 and a third metal wiring 123*c*. The wiring may include aluminum (Al), copper (Cu), tin (Sn), nickel (Ni), gold (Au), platinum (Pt), or an alloy thereof.

The first passivation layer 124 may be formed on the first wiring layer 122 and may expose at least portions of the first bonding pads 130. The first passivation layer 124 may include a plurality of stacked insulating layers. For example, the first passivation layer 124 may include an organic passivation layer including an oxide layer and an inorganic passivation layer including a nitride layer, sequentially stacked. The first passivation layer 124 may include silicon oxide, silicon nitride, silicon carbon nitride, etc.

The first bonding pad 130 may be formed on the third metal wiring 123*c* which is an uppermost wiring of the first wiring layer 122. The first bonding pad 130 may be exposed by the first passivation layer 124. Accordingly, the circuit pattern may be electrically connected to the first bonding pad 130 through the wirings. For example, the first bonding pad may include copper (Cu), aluminum (Al), molybdenum (Mo), titanium (Ti), gold (Au), silver (Ag), chromium (Cr), tin (Sn), Nickel (Ni), antimony (Sb), bismuth (Bi), zinc (Zn), indium (In), palladium (Pd), platinum (Pt), or an alloy thereof.

In example embodiments, the first test pads 140 may be provided in the first front insulating layer 120 on the first surface 112 of the first substrate 110. At least portions of the first test pads 140 may be exposed by the first passivation layer 124.

The first test pad 140 may be formed on the third metal wiring 123*c* of the first wiring layer 122. The first test pad 140 may be electrically connected to the first bonding pad 130 or the through electrode 150 through the wirings. The first test pad 140 may be formed to at least partially fill an opening of the first passivation layer 124 that exposes a test pad region.

For example, the first test pad 140 may include a metal having a thermal expansion coefficient greater than copper (Cu). The first test pad 140 may include aluminum (Al). In some embodiments, the first test pad 140 may include lead (Pb), zinc (Zn), or a mixture of a polymer and a metal having electrical conductivity.

As illustrated in FIG. 3, the first bonding pad 130 may have a first diameter D1, and the first test pad 140 may have a second diameter D2 greater than the first diameter D1. The second diameter D2 may be 2 to 10 times the first diameter D1. The first diameter D1 of the first bonding pad 130 may be in a range of 5 μm to 15 μm, and the second diameter D2 of the first test pad 140 may be in a range of 30 μm to 150 μm.

The through electrode 150 as a through silicon via (TSV) may be provided to vertically penetrate the first substrate 110 from the first surface 112 to the second surface 114 of the first substrate 110. A first end portion of the through electrode 150 may contact the first metal wiring of the first wiring layer. However, it is not limited thereto, and for example, the through electrode 150 may extend through the first wiring layer and may directly contact the first bonding pad 130.

A first backside insulating layer may be provided on the second surface 114 of the first substrate 110, that is, on the backside surface. Second bonding pads 160 may be provided on the first backside insulating layer. The second bonding pad 160 may be disposed on an exposed second end portion of the through electrode 150. Accordingly, the first and second bonding pads 130 and 160 may be electrically connected to each other through the through electrode 150.

The first and second bonding pads 130 and 160 may be arranged in respective arrays on upper and lower surfaces of the first semiconductor chip, and the through electrodes 150 may be arranged in the first substrate 110 in an array form. For example, the via arrangement of the through electrodes 150 may correspond to the pad arrangement of the second bonding pads 160.

In example embodiments, the second semiconductor chip 200 may include a second substrate 210, a second front insulating layer 220, a plurality of third bonding pads 230 and a plurality of second test pads 240.

In particular, the second substrate 210 may have a first surface 212 and a second surface 214 opposite to the first surface 212. The first surface 212 may be an active surface, and the second surface 214 may be an inactive surface. Circuit patterns may be provided on the first surface 212 of the second substrate 210. The first surface 212 may be referred to as a front side surface on which the circuit patterns are formed, and the second surface 214 may be referred to as a backside surface.

In example embodiments, the second semiconductor chip 200 may include the second front insulating layer 220 having the third bonding pads 230 on an outer surface thereof. The second front insulating layer 220 may be formed on the first surface 212 of the second substrate 210, that is, the front side surface. The second front insulating layer 220 may include a second wiring layer 222 and a second passivation layer 224. In addition, the third bonding pads 230 may be provided on the outermost insulating layer of the second front insulating layer 220.

The second wiring layer 222 may include a plurality of wirings 223 therein. For example, the second wiring layer 222 may include a metal wiring structure including a plurality of the wirings 223 that are vertically stacked in the buffer layer and the insulating layers. A plurality of the wirings may include a first metal wiring 223*a*, a first via V1, a second metal wiring 223*b*, a second via V2 and a third metal wiring 223*c*.

The second passivation layer 224 may be formed on the second wiring layer 222 and may expose at least portions of the third bonding pads 230. The second passivation layer 224 may include a plurality of stacked insulating layers. For example, the second passivation layer 224 may include an organic passivation layer including an oxide layer and an inorganic passivation layer including a nitride layer, sequentially stacked. The second passivation layer 224 may include silicon oxide, silicon nitride, silicon carbon nitride, etc.

The third bonding pad 230 may be formed on the third metal wiring 223*c* which is an uppermost wiring of the second wiring layer 222. The third bonding pad 230 may be exposed by the second passivation layer 224. Accordingly, the circuit pattern may be electrically connected to the third bonding pad 230 through the wirings.

In example embodiments, the second test pads 240 may be provided in the second front insulating layer 220 on the first surface 212 of the second substrate 210. At least portions of the second test pads 240 may be exposed by the second passivation layer 224.

The second test pad 240 may be formed on the third metal wiring 223*c* of the second wiring layer 222. The second test pad 240 may be electrically connected to the third bonding pad 230 through the wirings. The second test pad 240 may be formed to at least partially fill an opening of the second passivation layer 224 that exposes the test pad region.

For example, the second test pad 240 may include a metal having a thermal expansion coefficient greater than copper (Cu). The second test pad 240 may include aluminum (Al). In some embodiments, the second test pad 240 may include lead (Pb), zinc (Zn), or a mixture of a polymer and/or a metal having electrical conductivity.

The sizes and thicknesses of the first and second semiconductor chips, the number, size, arrangement, etc. of the insulating layers of the first and second wiring layers, the metal wirings, the first and second bonding pads and the first and second test pads are provided as examples, and it will be understood that it is not limited thereto. For example, the first semiconductor chip may have a thickness range of 50 μm to 120 μm, and the second semiconductor chip may have a thickness range of 40 μm to 700 μm.

The third bonding pads 230 and the second test pads 240 may be arranged in respective arrays on the upper surface of the second semiconductor chip. For example, the pad arrangement of the third bonding pads 230 may correspond to the pad arrangement of the first bonding pads 130, and the pad arrangement of the second test pads 240 may correspond to the pad arrangement of the first test pads 140.

As illustrated in FIG. 2, the first semiconductor chip 100 and the second semiconductor chip 200 may be bonded to each other by a thermal compression (TC) process. The first surface 212 of the second substrate 210 may face the first surface 112 of the first substrate 110. The second front insulating layer 220 and the first front insulating layer 120 may be directly bonded to each other. Accordingly, the first bonding pad 130 and the third bonding pad 230 between the first semiconductor chip 100 and the second semiconductor chip 200 may be bonded to each other by copper-copper hybrid bonding (pad to pad direct bonding).

The first passivation layer 124 of the first front insulating layer 120 and the second passivation layer 224 of the second front insulating layer 220 may be in contact with each other to provide a bonding structure including an insulating material, thereby providing excellent bonding strength. The first passivation layer 124 and the second passivation layer 224 may be bonded to each other by a high-temperature annealing process while in contact with each other. At this time, the bonding structure may have a relatively stronger bonding strength by covalent bonding.

In case that the first and second test pads 140 and 240 include a metal such as aluminum having a thermal expansion coefficient greater than copper, the first and second test pads 140 and 240 may be inflated by the thermal compression process, and thus, at least a portion of the first test pad 140 and at least a portion of the second test pad 240 may be directly bonded to each other. For example, when a peripheral portion of the bonding surface of the first test pad 140 and a peripheral portion of the bonding surface of the second test pad 240 are bonded to each other, an empty space S may be formed in a central region between the first and second test pads 140 and 240.

In example embodiments, the sealing member 400 may cover or overlap the second semiconductor chip 200 on the first semiconductor chip 100. The sealing member 400 may cover or overlap a side surface of the second semiconductor chip 200. An upper surface, that is, the backside surface of the second semiconductor chip 200 may be exposed by the sealing member 400. For example, the sealing member 400 may include a thermosetting resin or the like.

In example embodiments, the package substrate 300 may be a substrate having an upper surface 302 and a lower surface 304 opposite to each other. For example, the package substrate 300 may be a printed circuit board (PCB). The printed circuit board may be a multi-layered circuit board having vias and various circuits therein.

The first semiconductor chip 100 may be mounted on the package substrate 300 via the conductive bumps 170 formed on the second bonding pads 160. The first surface 112 of the first substrate 110 of the first semiconductor chip 100 may face the package substrate 300. The conductive bumps 170 of the first semiconductor chip 100 may be bonded to substrate pads 310 on the upper surface 302 of the package substrate 300. A planar area of the first semiconductor chip 100 may be smaller than a planar area of the package substrate 300. When viewed from a plan view, the first semiconductor chip 100 may be disposed within the package substrate 300.

In example embodiments, an underfill member 500 may be interposed between the first semiconductor chip 100 and the package substrate 300. For example, the underfill member may include an epoxy material to reinforce a gap between the first semiconductor chip 100 and the package substrate 300.

Outer connection pads 330 may be provided on the lower surface 304 of the package substrate 300, and the external connection members 600 may be respectively disposed on the outer connection pads 330. For example, the external connection member 600 may be a solder ball. The semiconductor package 10 may be mounted on a module substrate (not illustrated) via the solder balls to form a memory module.

As mentioned above, the semiconductor package 10 may include the first semiconductor chip 100 and the second semiconductor chip 200 stacked on the first semiconductor chip 100. The first passivation layer 124 of the first front insulating layer 120 of the first semiconductor chip 100 and the second passivation layer 224 of the second front insulating layer 220 of the second semiconductor chip 200 may be directly bonded to each other. The first bonding pad 130 of the first semiconductor chip 100 and the third bonding pad 230 of the second semiconductor chip 200 may be bonded to each other by copper-copper hybrid bonding (pad to pad direct bonding).

The first passivation layer 124 may expose at least portions of the first bonding pads 130 and the first test pads 140 provided on the first surface 112 of the first substrate 110. The second passivation layer 224 may expose at least portions of the third bonding pads 230 and the second test pads 240 provided on the first surface 212 of the second substrate 210.

Accordingly, after performing an inspection process such as an electrical die sorting (EDS) process using the first and second test pads 240, since there is no need to perform processes of forming a passivation layer and bonding pads on the test pads, the manufacturing processes may be simplified.

Further, during the hybrid bonding process of the first and second semiconductor chips, the at least a portion of the first test pad 140 and the at least a portion of the second test pad 240 may be directly bonded to each other. Accordingly, surface flatness in the peripheral regions between the first and test pads may be increased to improve bonding quality in the hybrid bonding process.

Hereinafter, a method of manufacturing the semiconductor package of FIG. 1 will be described.

FIGS. 4 to 20 are views illustrating a method of manufacturing a semiconductor package in accordance with example embodiments. FIGS. 5 to 8 are enlarged cross-sectional views illustrating portion 'B' in FIG. 4. FIG. 10 is an enlarged cross-sectional view illustrating portion 'C' in FIG. 9. FIG. 14 is an enlarged cross-sectional view illustrating portion 'D' in FIG. 13. FIG. 17 is an enlarged cross-sectional view illustrating portion 'E' in FIG. 16.

Figure 4:
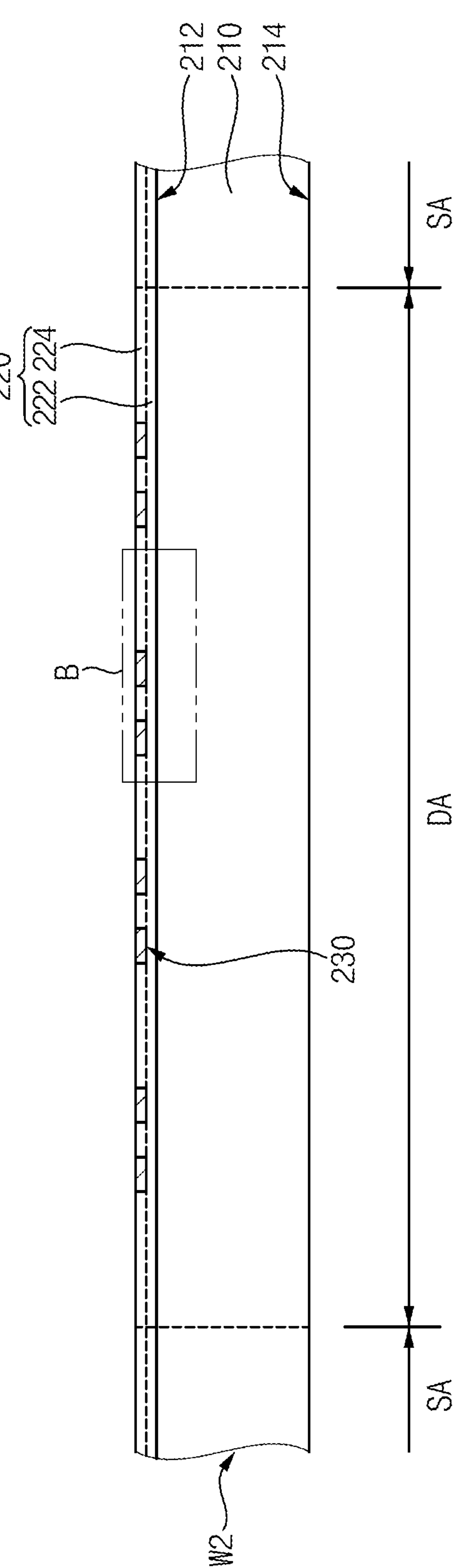
Figure 5:
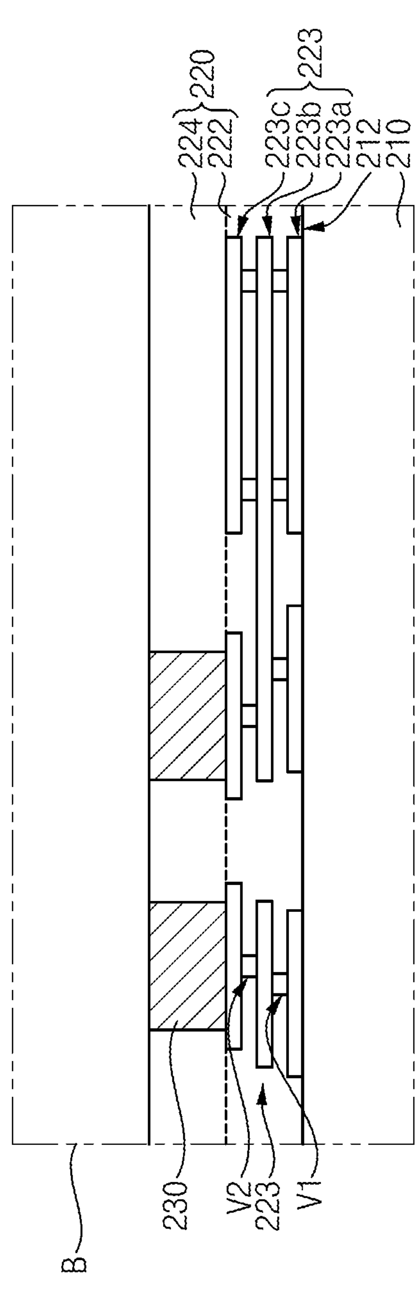

Referring to FIGS. 4 and 5, firstly, a second wafer W2 including a plurality of second semiconductor chips (dies) formed therein may be prepared.

In example embodiments, the second wafer W2 may include a second substrate 210 and a second front insulating layer 220 having third bonding pads 230 formed on an outer surface thereof.

The second substrate 210 may have a first surface 212 and a second surface 214 opposite to the first surface 212. The second substrate 210 may include a die region DA where circuit patterns and cells are formed and a scribe lane region CA surrounding the die region DA. The second substrate 210 may be cut along the scribe lane region CA that divides the plurality of die regions DA of the second wafer W2 by a following dicing process (singulation process) to be individualized to second semiconductor chips.

For example, the second substrate 210 may include silicon, germanium, silicon-germanium, or III-V compounds, e.g., GaP, GaAs, GaSb, etc. In some embodiments, the second substrate 210 may be a silicon-on-insulator (SOI) substrate, or a germanium-on-insulator (GOI) substrate.

The circuit elements may include, for example, transistors, capacitors, wiring structures, etc. The circuit elements may be formed on the first surface 212 of the second substrate 210 by performing a Fab process called a Front End of Line (FEOL) process for manufacturing semiconductor devices. A surface of the second substrate on which the FEOL process is performed may be referred to as a front side surface of the second substrate, and a surface opposite to the front side surface may be referred to as a backside surface. An insulation interlayer covering or overlapping the circuit elements may be formed on the first surface 212 of the second substrate 210.

The second front insulating layer 220 may be formed on the first surface 212 of the second substrate 210, that is, the front side surface. The second front insulating layer 220 may include a second wiring layer 222 and a second passivation layer 224. In addition, the third bonding pads 230 may be provided on an outermost insulating layer of the second front insulating layer 220.

In particular, the second wiring layer 222 may include a plurality of buffer layers and insulating layers alternately formed on one another. For example, the buffer layer may include silicon nitride, silicon carbon nitride, carbon- and nitride-doped silicon oxide (SiCON), etc. The insulating layer may include silicon oxide, carbon-doped silicon oxide, silicon carbon nitride (SiCN), etc.

The second wiring layer 222 may include a plurality of wirings 223 therein. For example, the second wiring layer 222 may include a metal wiring structure including a plurality of the wirings 223 that are vertically stacked in the buffer layers and the insulating layers. A plurality of the wirings may include a first metal wiring 223*a*, a first via V1, a second metal wiring 223*b*, a second via V2 and a third metal wiring 223*c*. The wiring may include aluminum (Al), copper (Cu), tin (Sn), nickel (Ni), gold (Au), platinum (Pt), or an alloy thereof.

The second passivation layer 224 may be formed on the second wiring layer 222 and may expose at least portions of the third bonding pads 230. The second passivation layer 224 may include a plurality of stacked insulating layers. For example, the second passivation layer 224 may include an organic passivation layer including an oxide layer and an inorganic passivation layer including a nitride layer, sequentially stacked. The second passivation layer 224 may include silicon oxide, silicon nitride, silicon carbon nitride, etc.

The third bonding pad 230 may be formed on the third metal wiring 223*c* which is an uppermost wiring of the second wiring layer 222. The third bonding pad 230 may be exposed by the second passivation layer 224. Accordingly, the circuit pattern may be electrically connected to the third bonding pad 230 through the wirings. For example, the third bonding pad may include copper (Cu), aluminum (Al), molybdenum (Mo), titanium (Ti), gold (Au), silver (Ag), chromium (Cr), tin (Sn), Nickel (Ni), antimony (Sb), bismuth (Bi), zinc (Zn), indium (In), palladium (Pd), platinum (Pt), or an alloy thereof.

Referring to FIGS. 6 to 10, second test pads 240 may be formed in the second front insulating layer 220 on the first surface 212 of the second substrate 210. At least portions of the second test pads 240 may be exposed by the second passivation layer 224.

Figure 6:
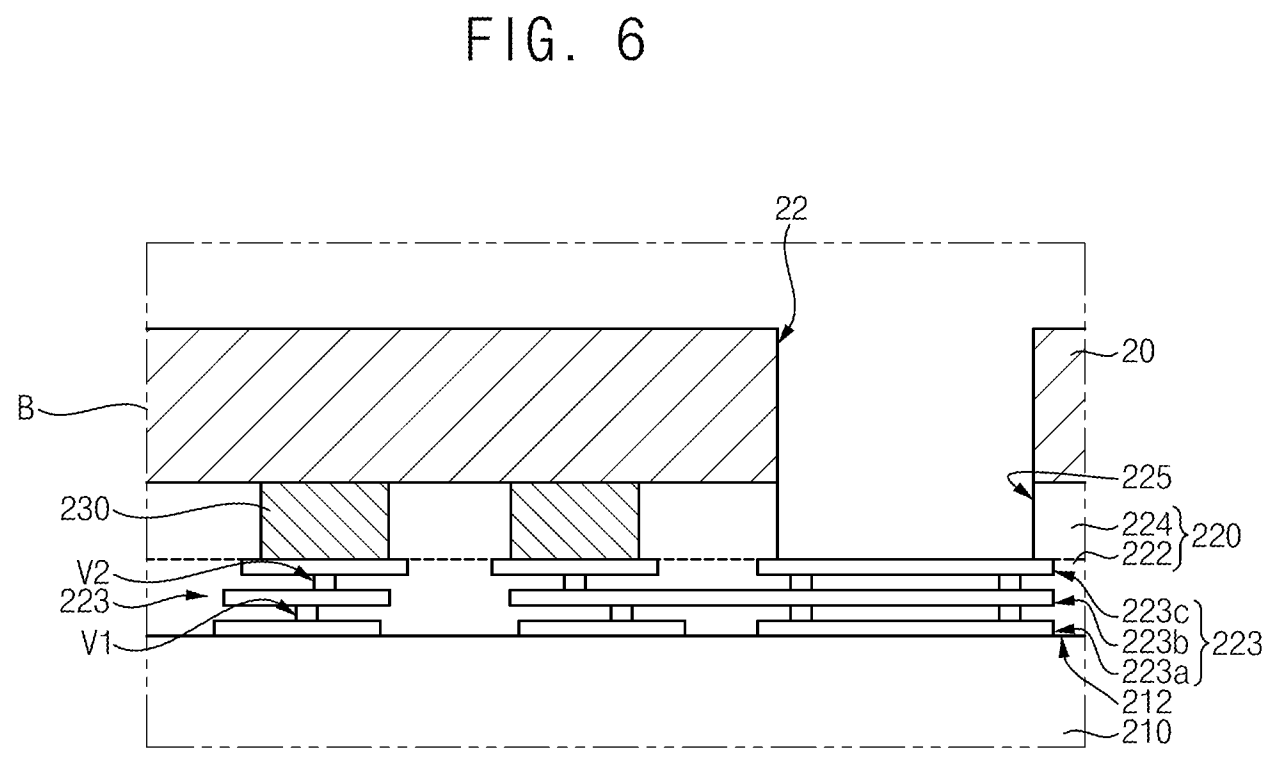

As illustrated in FIG. 6, a first photoresist pattern 20 having a first opening 22 that exposes a test pad region may be formed on the second passivation layer 224, and the second passivation layer 224 may be etched using the first photoresist pattern 20 as an etching mask to form an opening 225 that exposes the third metal wiring 223*c* in the test pad region. Then, the first photoresist pattern 20 may be removed from the second substrate 210.

Figure 7:
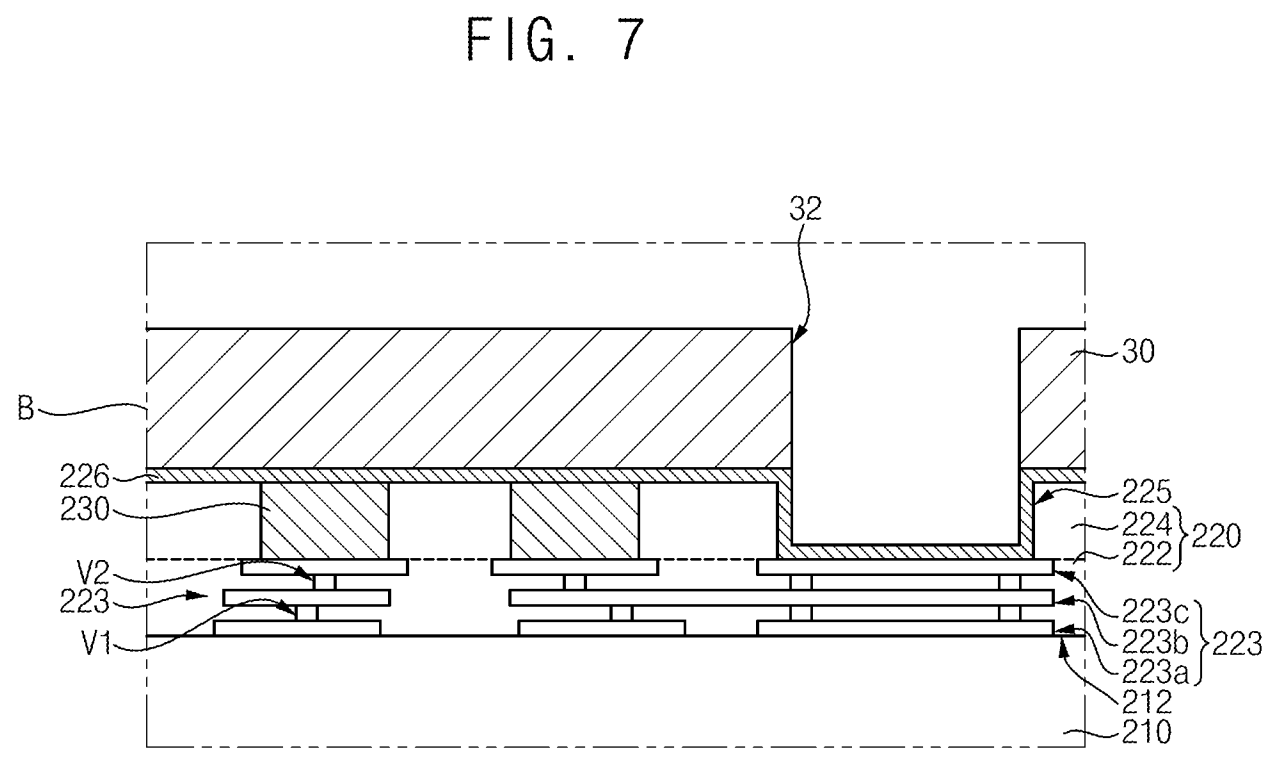

As illustrated in FIG. 7, a seed layer 226 may be formed on the second passivation layer 224 and the third metal wiring 223*c* in the opening 225, and a second photoresist pattern 30 having a second opening 32 that exposes the test pad region may be formed on the seed layer 226. For example, the seed layer may include titanium (Ti), titanium nitrogen compound (TiN), tantalum (Ta), tantalum nitrogen compound (TaN), chromium nitrogen compound (CrN), cobalt (Co), nickel (Ni), etc.

Figure 8:
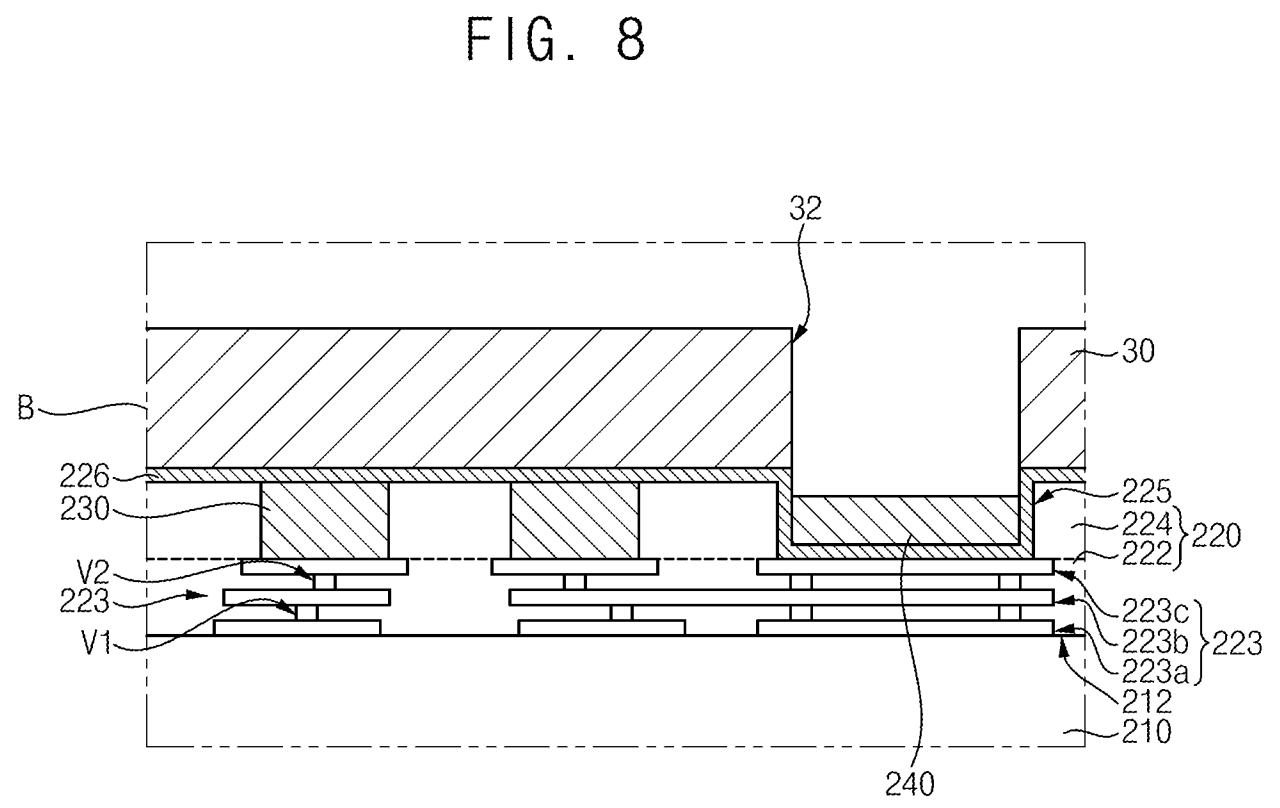

As illustrated in FIG. 8, an electrolytic plating process may be performed to form the second test pad 240 on the third metal wiring 223*c* of the second wiring layer 222 exposed by the second opening 32 of the second photoresist pattern 30. The second test pad 240 may be formed in the opening 225 of the second passivation layer 224. The second test pad 240 may be formed to at least partially fill the opening 225 of the second passivation layer 224. For example, the second test pad 240 may include a metal having a thermal expansion coefficient greater than copper (Cu). The second test pad 240 may include aluminum (Al). In some embodiments, the second test pad 240 may include lead (Pb), zinc (Zn), or a mixture of a polymer and a metal having electrical conductivity.

Figure 9:
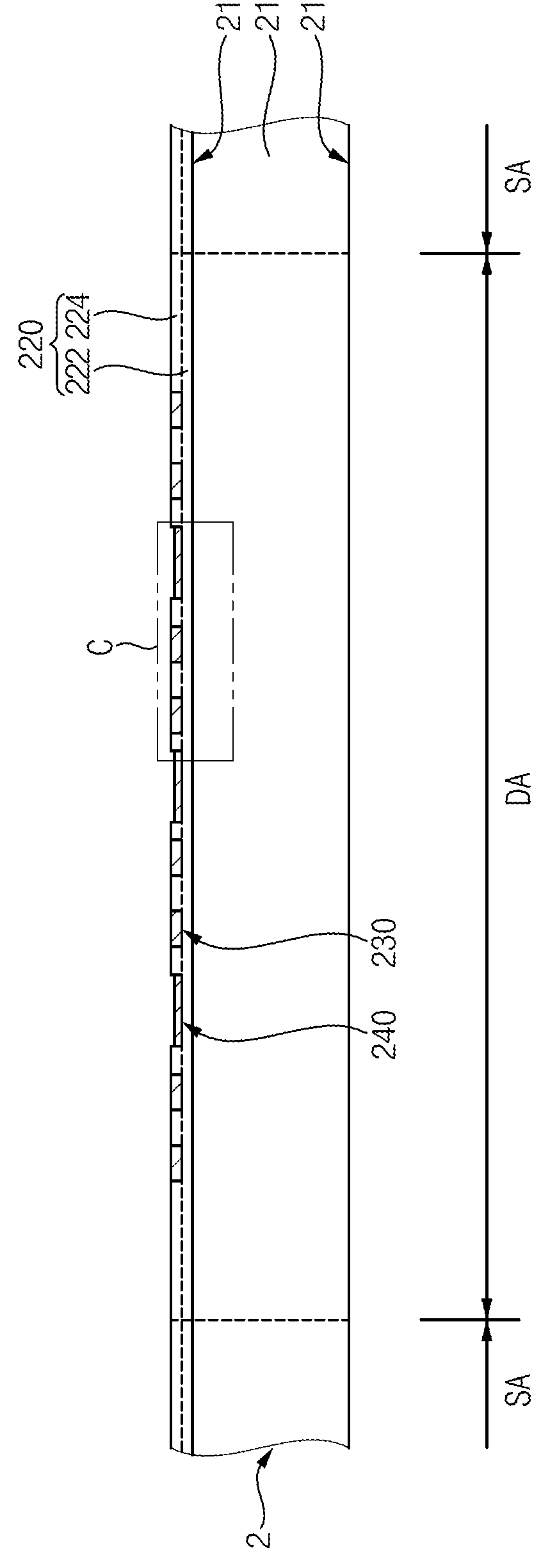
Figure 10:
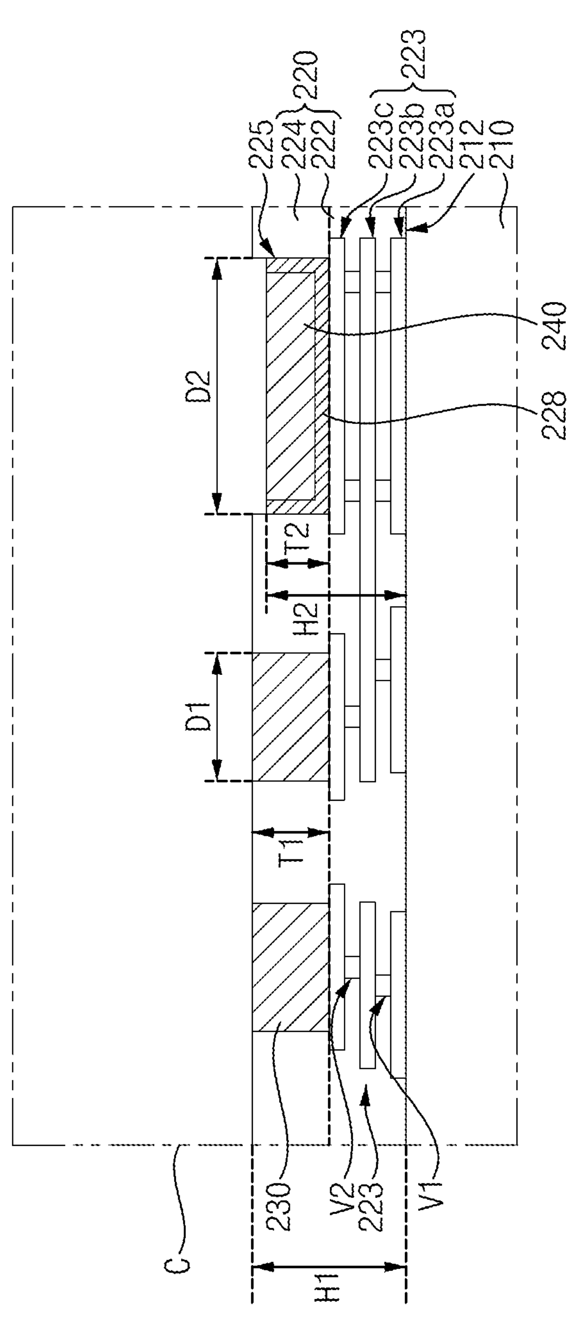

As illustrated in FIGS. 9 and 10, the second photoresist pattern 30 may be removed by a strip process and a portion of the seed layer exposed by the second test pad 240 may be etched to form a seed layer pattern 228.

The second test pad 240 may be formed on the third metal wiring 223*c* of the second wiring layer 222. The second test pad 240 may be electrically connected to the third bonding pad 230 through the wirings. The second test pad 240 may be formed in the opening 225 of the second passivation layer 224.

The third bonding pad 230 may have a first thickness T1, and the second test pad 240 may have a second thickness T2 smaller than the first thickness T1. The third bonding pad 230 may have a first height H1 from the first surface 212 of the second substrate 210, and the second test pad 240 may have a second height H2 from the first surface 212 of the second substrate 210. The first height H1 may be greater than the second height H2. The third bonding pad 230 may have a first diameter D1, and the second test pad 240 may have a second diameter D2 greater than the first diameter D1. The second diameter D2 may be 2 to 10 times the first diameter D1. The first diameter D1 of the third bonding pad 230 may be in the range of 5 μm to 15 μm, and the second diameter D2 of the second test pad 240 may be in a range of 30 μm to 150 μm.

After forming the second test pads 240, an inspection process such as an electrical die sorting (EDS) process may be performed. The EDS process may be a process of selecting good products by checking a state of each chip (die) formed by the previous process through various electrical property tests in a wafer level. During the EDS process, fine probe pins of the probe card may contact the second test pads 240 to transmit test signals and detect electrical signals.

Figure 11:
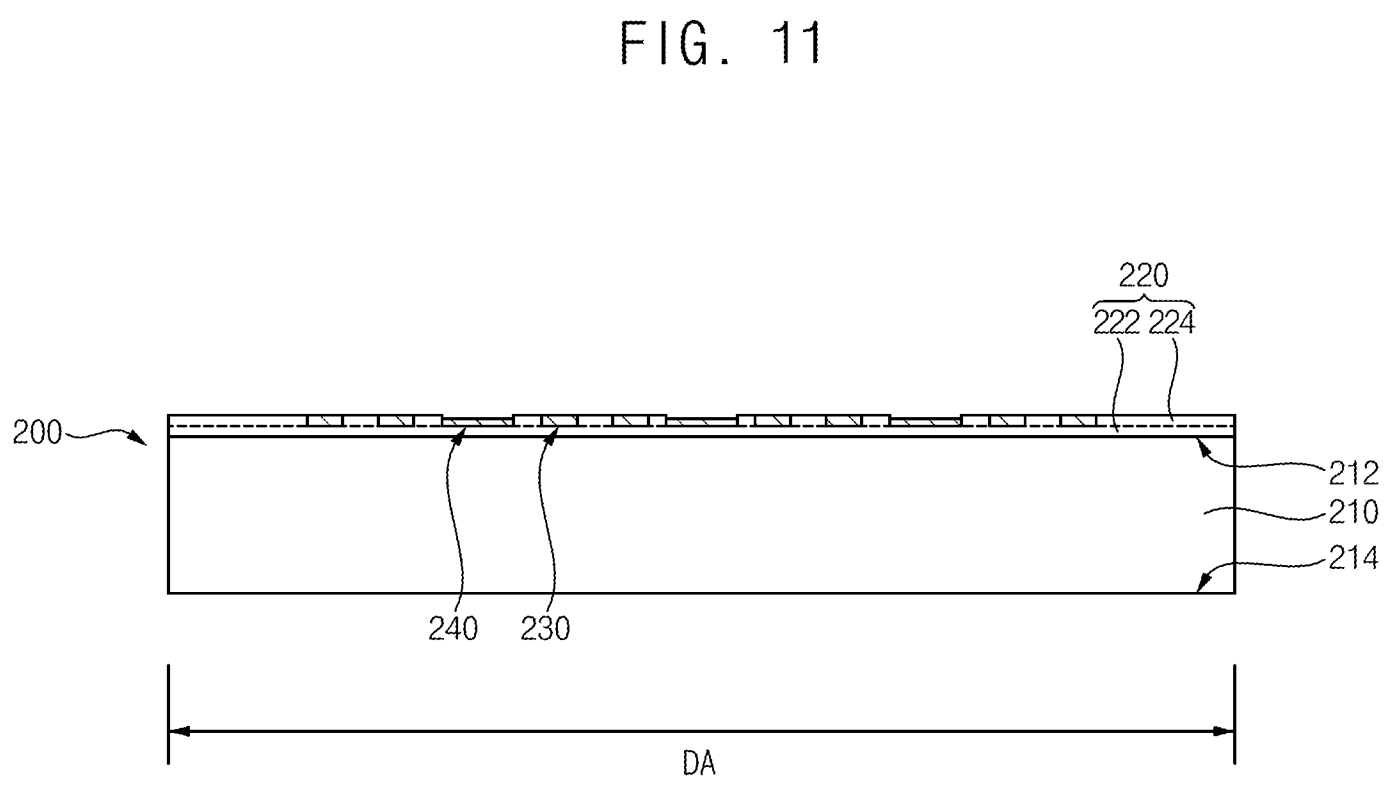

Referring to FIG. 11, the second wafer W2 may be cut along the scribe lane region SA to form an individual second semiconductor chip 200. The second wafer W2 may be cut by a sawing process.

Figure 12:
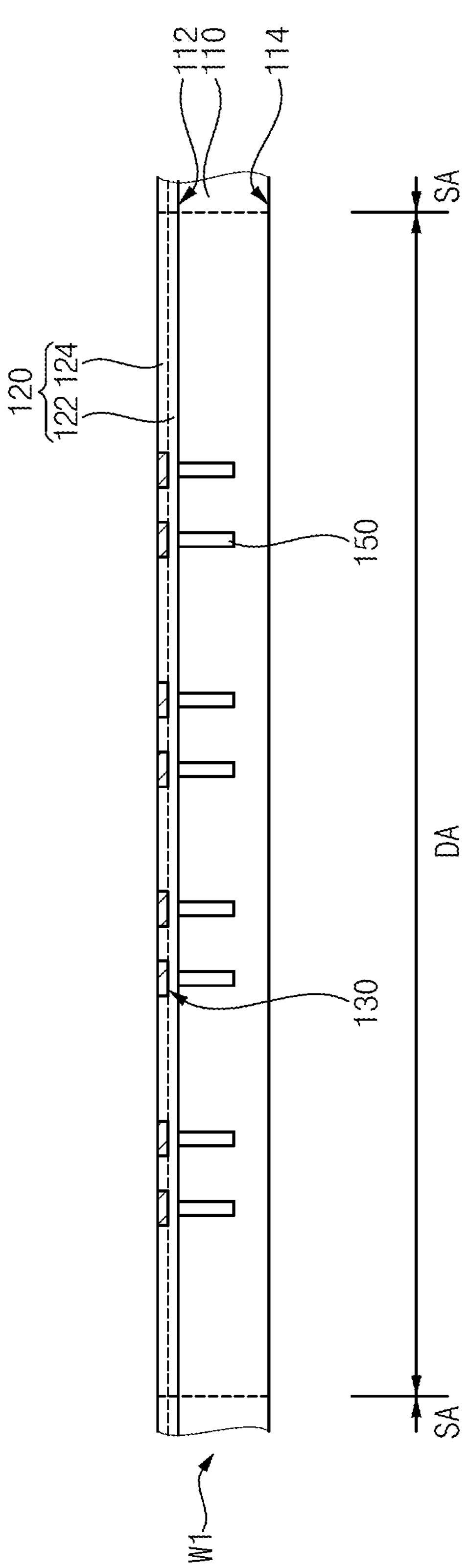

Referring to FIG. 12, a first wafer W1 including a plurality of first semiconductor chips (dies) formed therein may be prepared.

In example embodiments, the first wafer W1 may include a first substrate 110, a first front insulating layer 120 having first bonding pads 130 on an outer surface thereof, and a plurality of through electrodes 150 that partially penetrate the first substrate 110.

The first substrate 110 may have a first surface 112 and a second surface 114 opposite to the first surface 112. The first substrate 110 may include a die region DA where circuit patterns and cells are formed and a scribe lane region CA surrounding the die region DA. The second substrate 210 may be cut along the scribe lane region CA that divides the plurality of die regions DA of the second wafer W2 by a subsequent dicing process (singulation process) to be individualized to first semiconductor chips.

The first front insulating layer 120 may be formed on the first surface 112 of the first substrate 110, that is, a front side surface. The first front insulating layer 120 may include a first wiring layer 122 and a first passivation layer 124. In addition, the first bonding pads 130 may be provided on an outermost insulating layer of the first front insulating layer 120.

The through electrode 150 may extend from the first surface 112 of the first substrate 110 to a predetermined depth. The through electrode 150 may be electrically connected to a metal wiring structure of the first wiring layer 122. The through electrode 150 may be electrically connected to the first bonding pad 130 through the metal wiring structure.

Figure 13:
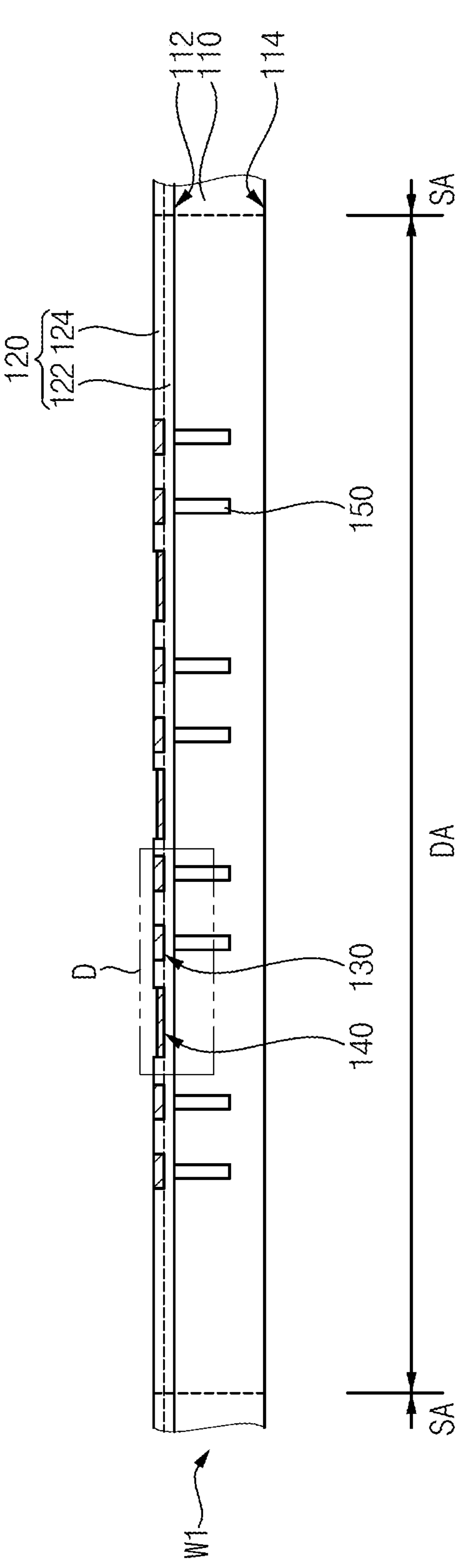
Figure 14:
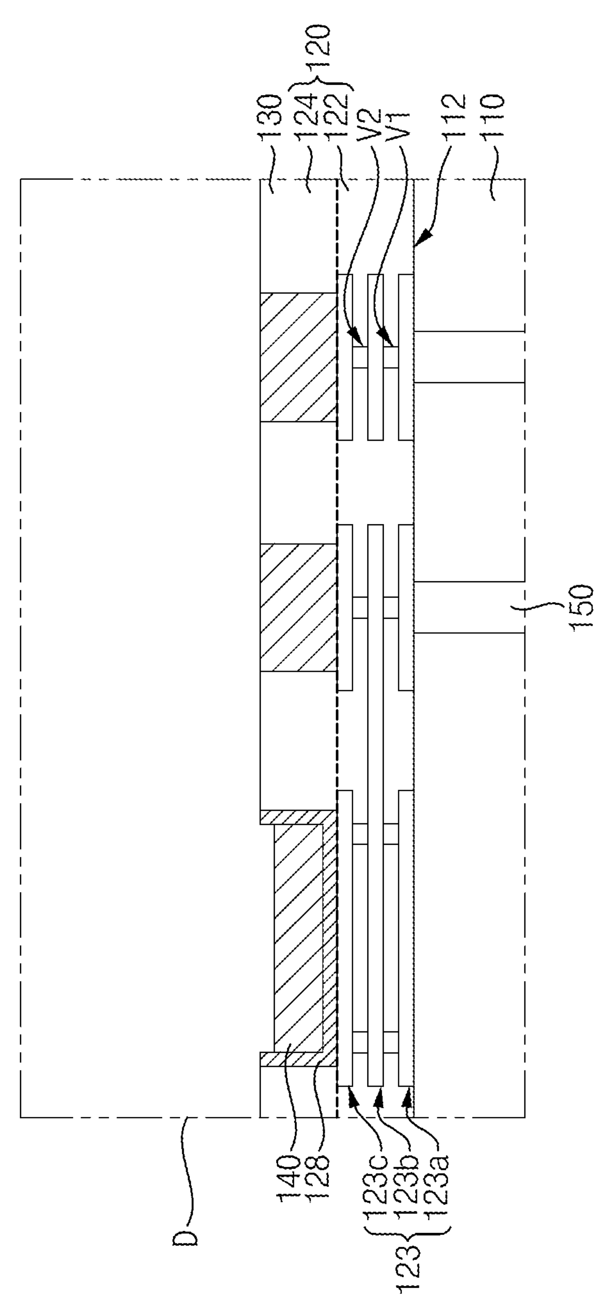

As illustrated in FIGS. 13 and 14, processes that are the same as or similar to the processes described with reference to FIGS. 6 to 10 are described. These processes describe forming first test pads 140 in the first front insulating layer 120 on the first surface 112 of the first substrate 110. At least portions of the first test pads 140 may be exposed by the first passivation layer 124.

The first test pad 140 may be formed on a third metal wiring 123*c* of the first wiring layer 122. The first test pad 140 may be electrically connected to the through electrode 150 through wirings of the first wiring layer 122. The first test pad 140 may be formed in the first passivation layer 124.

After forming the first test pads 140, an inspection process such as an electrical die sorting (EDS) process may be performed. During the EDS process, fine probe pins of a probe card may contact the first test pads 140 to transmit test signals and detect electrical signals.

Figure 15:
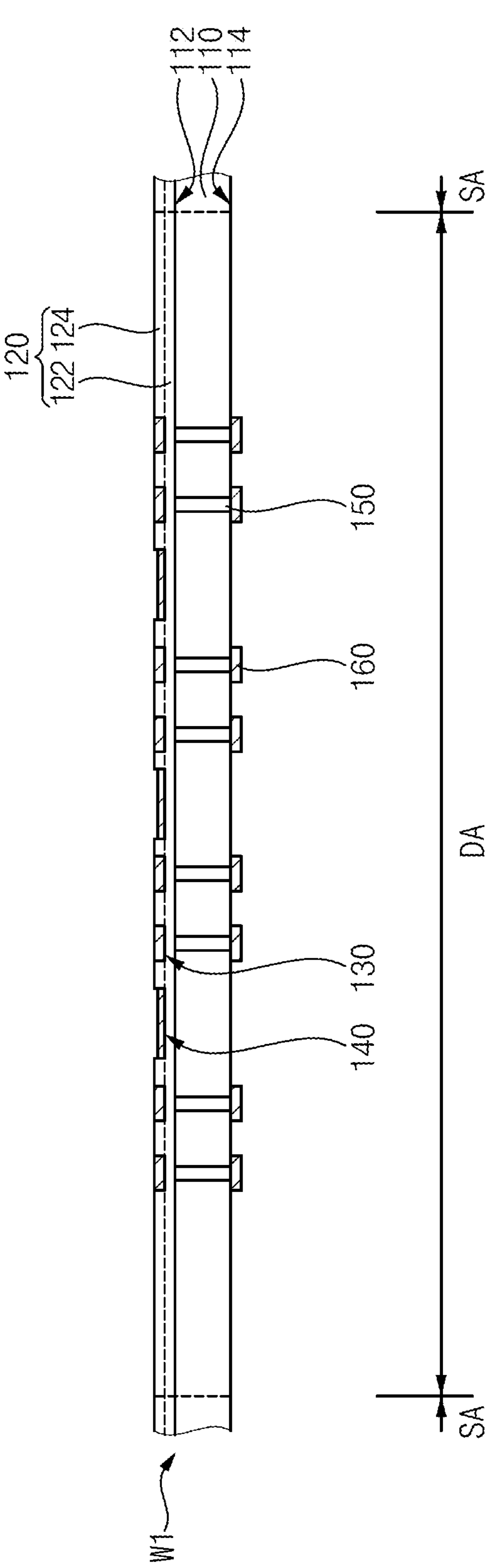

Referring to FIG. 15, second bonding pads 160 may be formed on the second surface 114 of the first substrate 110.

In example embodiments, a backside surface, that is, the second surface 114 of the first substrate 110 may be polished using a substrate support system (WSS). The second surface 114 of the first substrate 110 may be removed until a portion of the through electrode 150 is exposed.

The second surface 114 of the first substrate 110 may be partially removed by a grinding process such as a chemical mechanical polishing (CMP) process. Accordingly, a thickness of the first substrate 110 may be reduced to a desired thickness. For example, the first substrate 110 may have the thickness in a range of from about 40 μm to about 150 μm In addition, one end portion of the through electrode 150 may be exposed from the second surface 114 of the first substrate 110.

Then, the second bonding pad 160 may be formed on the second surface 114 of the first substrate 110 to be electrically connected to the through electrode 150. The second bonding pad 160 may be formed in a backside insulating layer serving as a passivation layer. The backside insulating layer may be formed on the second surface 114 of the first substrate 110 to expose the second bonding pad 160.

Figure 16:
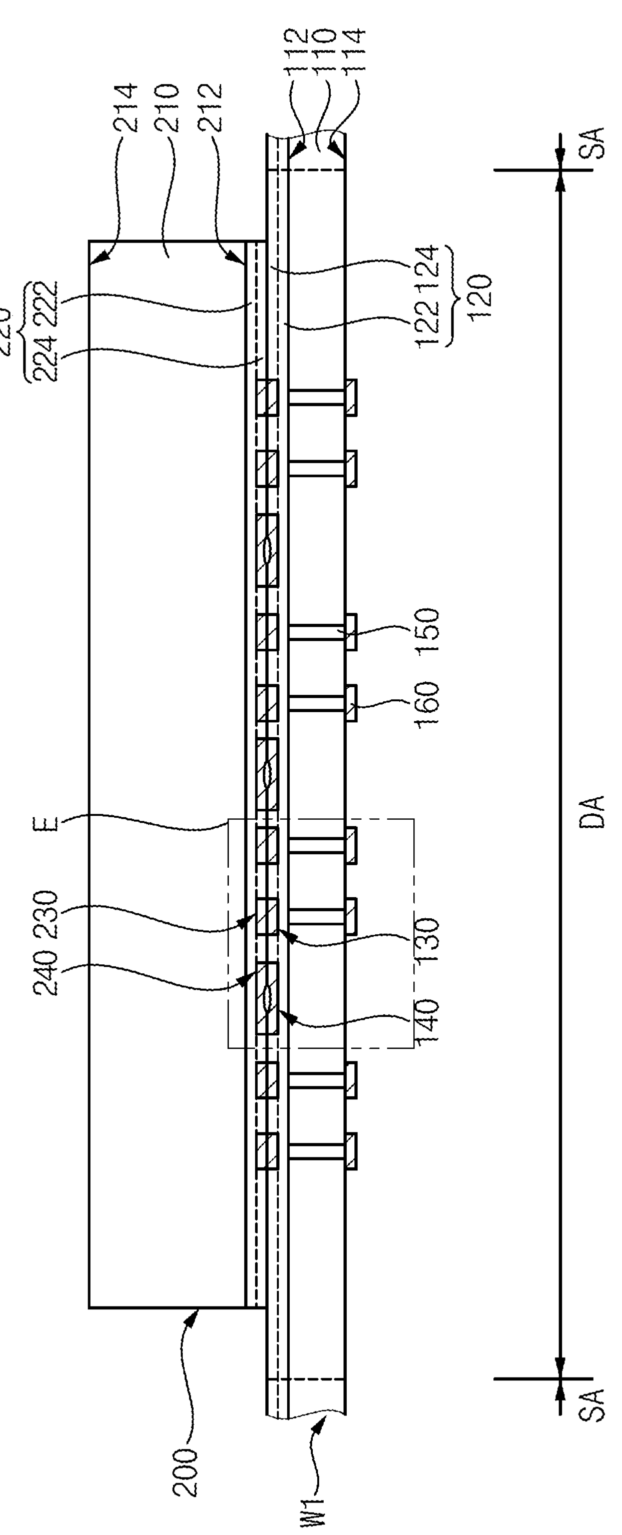
Figure 17:
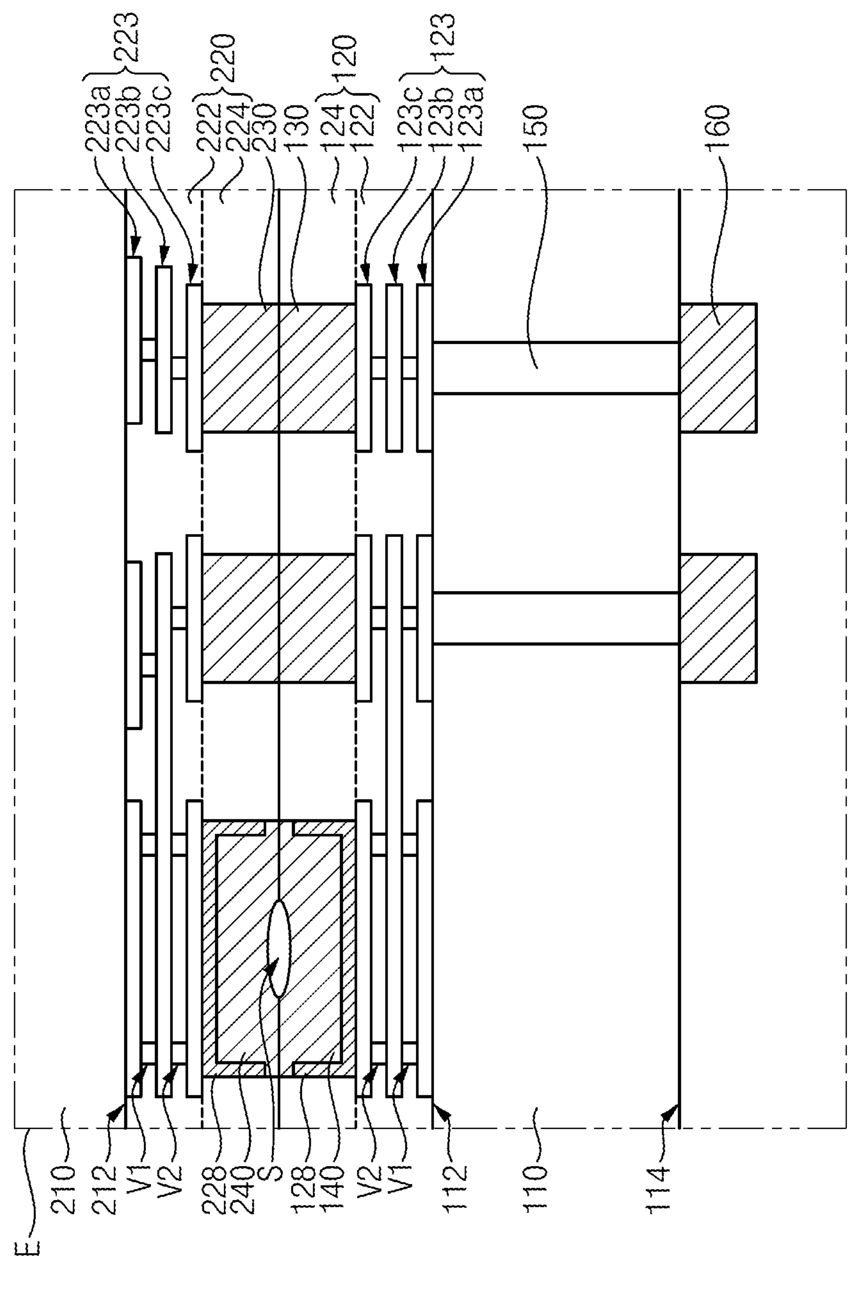

Referring to FIGS. 16 and 17, a plurality of the second semiconductor chips 200 may be attached to the first wafer W1 (die-to-wafer hybrid bonding process).

In example embodiments, the second semiconductor chips 200 may be disposed on the first wafer W1 to correspond to the die regions DA. The second semiconductor chip 200 may be arranged such that the first surface 212 of the second substrate 210 faces the first wafer W1.

A die bonding apparatus may pick up the individualized second semiconductor chips 200 through the sawing process and bond them to the first wafer W1. The die bonding apparatus may performs a thermal compression (TC) process at a predetermined temperature (eg, about 400° C. or less) to attach the second semiconductor chip 200 on the first surface 112 of the first wafer W1. By the thermal compression process, the second semiconductor chip 200 and the first wafer W1 may be bonded to each other through hybrid bonding. That is, the second front insulating layer 220 on the front surface of the second semiconductor chip 200, that is, the first surface 212 of the second substrate 210 may be directly bonded to the first front insulating layer 120 on the first substrate 110 of the first wafer W1.

The first bonding pad 130 of the first wafer W1 and the third bonding pad 230 of the second semiconductor chip 200 may contact each other. The front surface of the second semiconductor chip 200 and the front surface of the first wafer W1 may be bonded to face each other. When the first wafer W1 and the second semiconductor chip 200 are bonded to each other by wafer-to-die bonding, the first bonding pad 130 of the first wafer W1 and the third bonding pads 230 of the second semiconductor chip 200 may be bonded to each other by copper-copper hybrid bonding (Cu—Cu hybrid bonding).

In case that the first and second test pads 140 and 240 include a metal such as aluminum having a thermal expansion coefficient greater than copper, the first and second test pads 140 and 240 may be inflated by the thermal compression process, and thus, at least a portion of the first test pad 140 and at least a portion of the second test pad 240 may be directly bonded to each other. For example, when a peripheral portion of the bonding surface of the first test pad 140 and a peripheral portion of the bonding surface of the second test pad 240 are bonded to each other, an empty space S may be formed in a central region between the first and second test pads 140 and 240.

Figure 18:
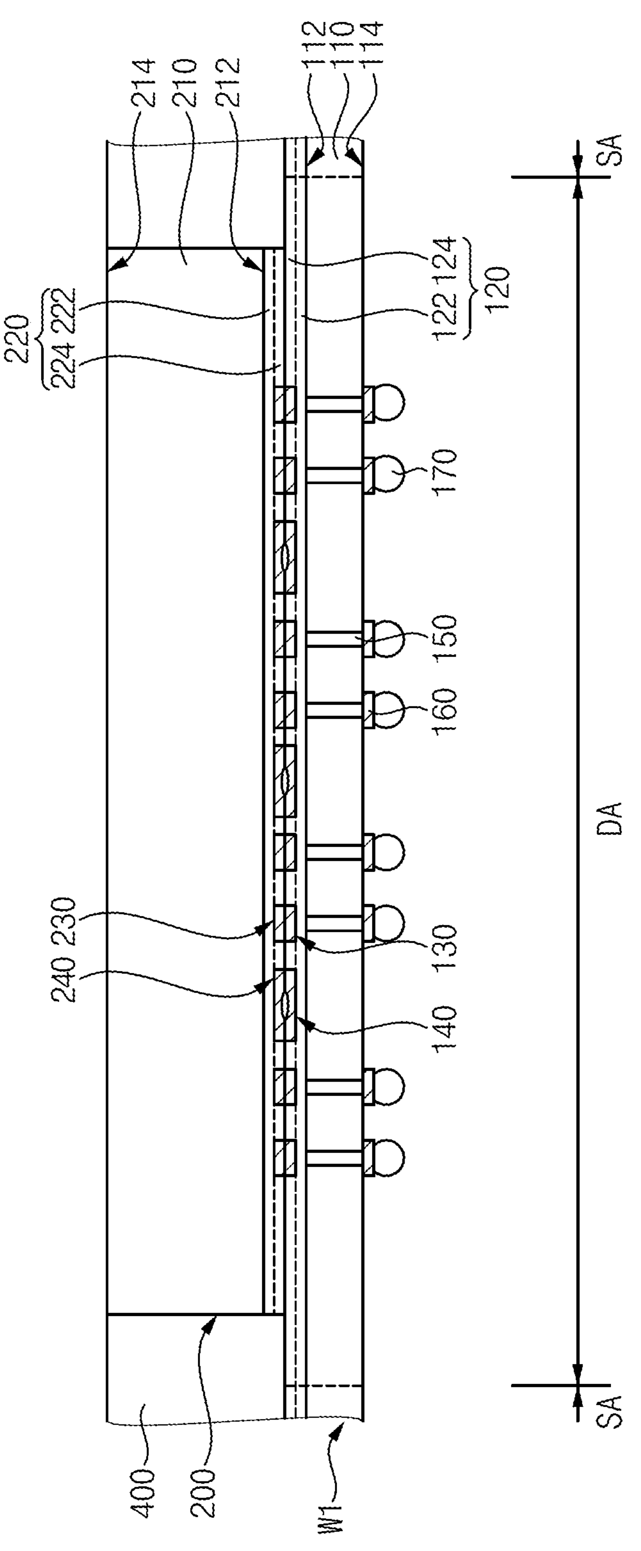

Referring to FIG. 18, a sealing member 400 may be formed on the first wafer W1 to cover, overlap, or be on the second semiconductor chip 200.

In example embodiments, the sealing member 400 may be formed to fill spaces between the second semiconductor chips 200 on the first wafer W1. The sealing member 400 may be formed to surround the second semiconductor chips 200 in a plan view. An upper surface, that is, the backside surface of the second semiconductor chip 200 may be exposed by the sealing member 400. The sealing member 400 may be formed by a dispensing process or a spin coating process. For example, the sealing member 400 may include a thermosetting resin or the like.

Then, conductive bumps 170 may be formed on the second bonding pads 160 of the first wafer W1. The conductive bumps may be formed by a plating process. In some embodiments, the conductive bumps may be formed by a screen printing method, a deposition method, etc. The conductive bumps may include solder bumps.

Figure 19:
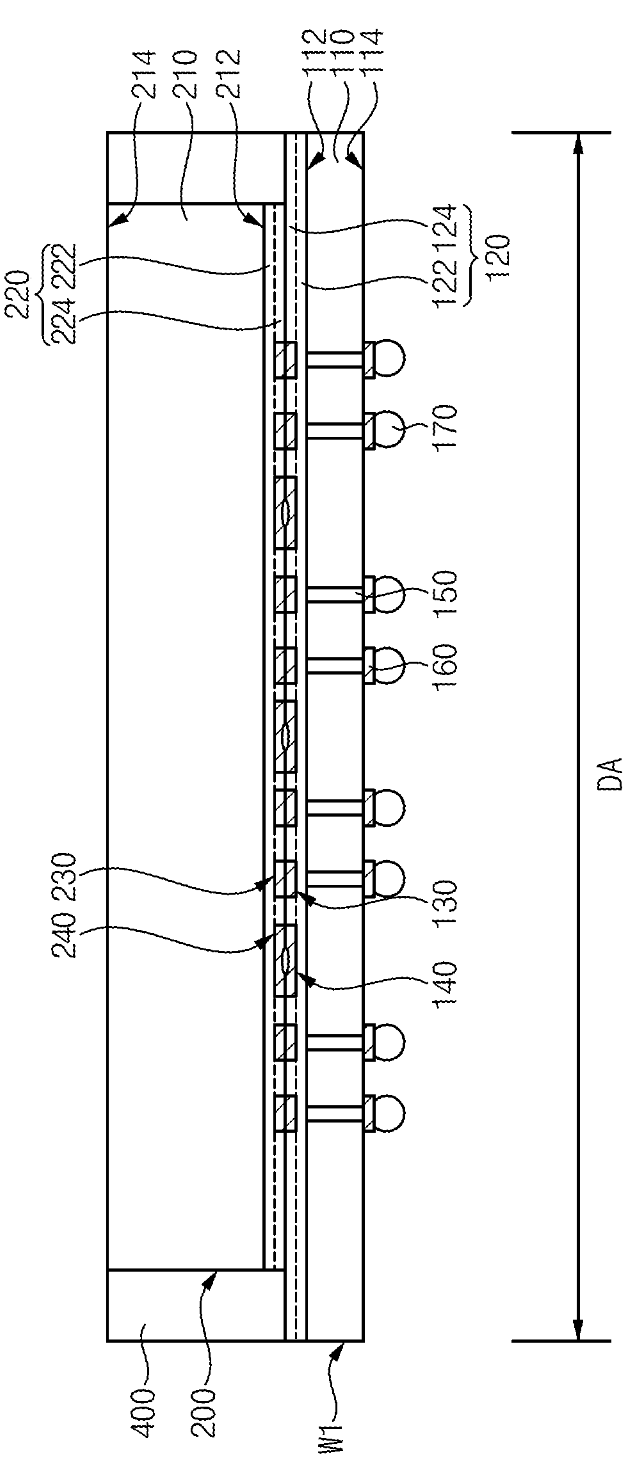

Referring to FIG. 19, the first wafer W1 and the sealing member 400 may be cut along the scribe lane region SA to form an individualized first semiconductor chip 100. The second wafer W2 may be cut by a sawing process. Thus, a stack package in which the second semiconductor chip 200 is stacked on the first semiconductor chip 100 may be formed.

Figure 20:
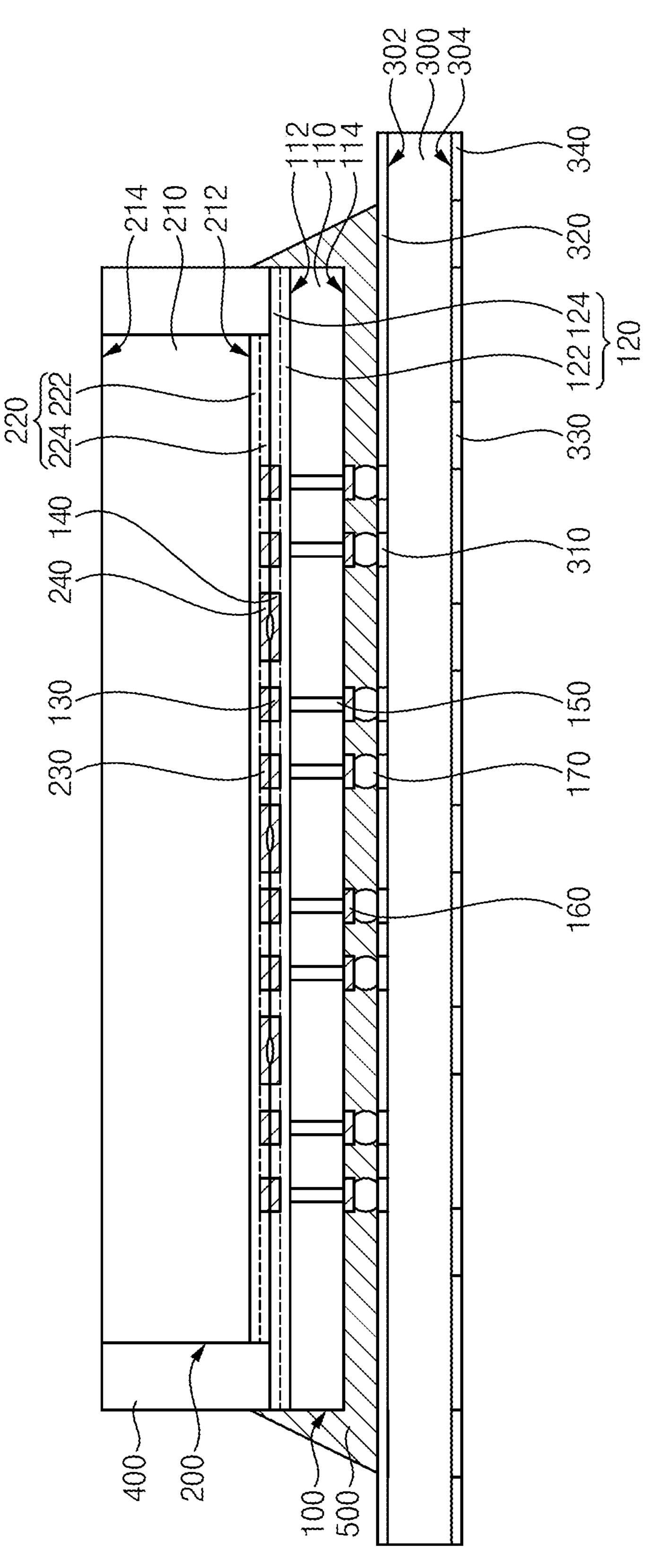

Referring to FIG. 20, the stack package may be mounted on a package substrate 300.

In example embodiments, the first semiconductor chip 100 may be mounted on the package substrate 300 via the conductive bumps 170. The second surface 112 of the first substrate 110 of the first semiconductor chip 100 may face the package substrate 300. The conductive bumps 170 of the first semiconductor chip 100 may be bonded to substrate pads 310 on an upper surface 302 of the package substrate 300.

Then, an underfill member 500 may be underfilled between the first semiconductor chip 100 and the package substrate 300. While moving a dispenser nozzle along an edge of the first semiconductor chip 100, an underfill solution may be dispensed between the first semiconductor chip 100 and the package substrate 300, and the underfill solution may be cured to form an underfill member 500. The underfill member 500 may have inclined side surfaces.

For example, the underfill member 500 may include an epoxy material to reinforce a gap between the first semiconductor chip 100 and the package substrate 300.

Then, external connection members 600 (see FIG. 1) may be formed on outer connection pads 330 on a lower surface 304 of the package substrate 300 to complete the semiconductor package 10 of FIG. 1.

Figure 21:
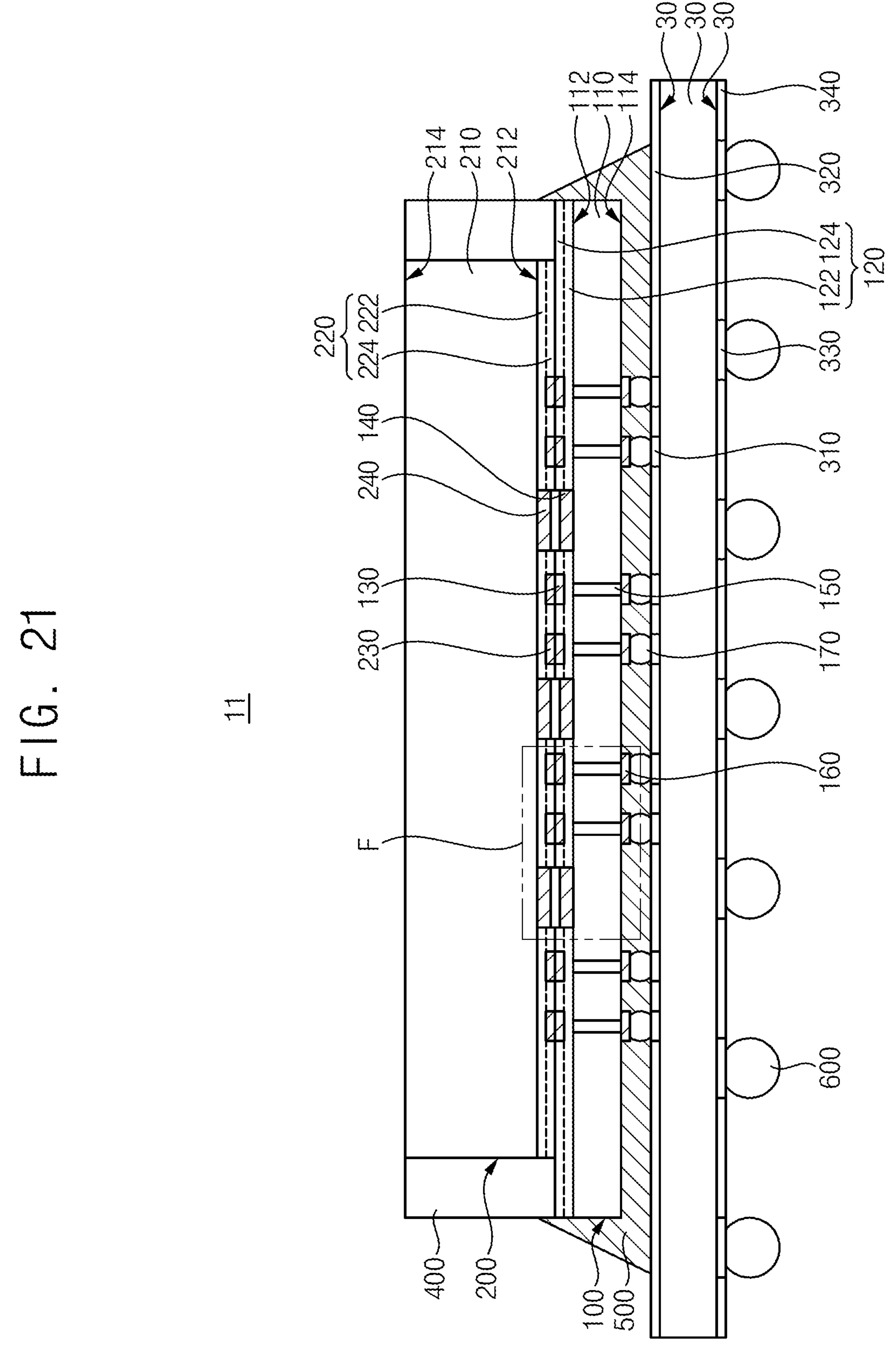
Figure 22:
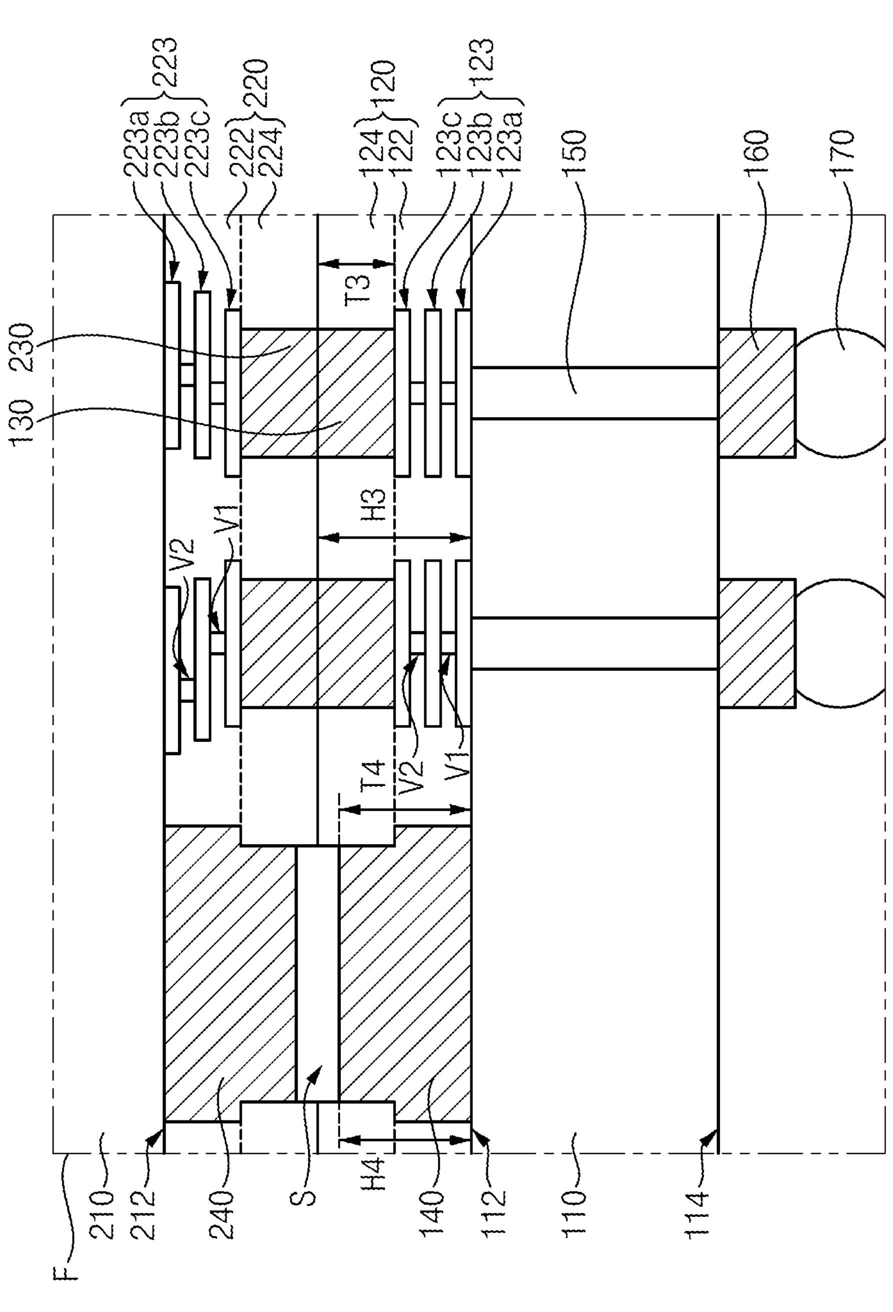

FIG. 21 is a cross-sectional view illustrating a semiconductor package in accordance with example embodiments. FIG. 22 is an enlarged cross-sectional view illustrating portion 'F' in FIG. 21. The semiconductor package may be substantially the same as the semiconductor package described with reference to FIGS. 1 to 3 except for arrangements of first and second test pads. Thus, same reference numerals will be used to refer to the same or like elements and any further repetitive explanation concerning the above elements will be omitted.

Referring to FIGS. 21 and 22, a semiconductor package 11 may include a first semiconductor chip 100 and a second semiconductor chip 200 stacked on the first semiconductor chip 100. In addition, the semiconductor package 11 may include a sealing member 400, a package substrate 300 on which the stacked first and second semiconductor chips 100 and 200 are mounted, and external connection members 600 provided on a lower surface of the package substrate 300.

In example embodiments, the first semiconductor chip 100 may include a first front insulating layer 120 having first bonding pads 130 on an outer surface thereof. The first front insulating layer 120 may be formed on a first surface 112 of the first substrate 110, that is, a front side surface. The first front insulating layer 120 may include a first wiring layer 122 and a first passivation layer 124. In addition, the first bonding pads 130 may be provided on an outermost insulating layer of the first front insulating layer 120.

First test pads 140 may be formed in the first wiring layer 122. A first passivation layer 124 may be provided on the first wiring layer 122, and the first passivation layer 124 may expose at least portions of the first test pads 140 in the underlying first wiring layer 122.

In example embodiments, the second semiconductor chip 200 may include a second front insulating layer 220 having third bonding pads 230 on an outer surface thereof. The second front insulating layer 220 may be formed on a first surface 212 of the second substrate 210, that is, a front side surface. The second front insulating layer 220 may include a second wiring layer 222 and a second passivation layer 224. In addition, the third bonding pads 230 may be provided on an outermost insulating layer of the second front insulating layer 220.

Second test pads 240 may be formed in the second wiring layer 222. A second passivation layer 224 may be provided on the second wiring layer 222, and the second passivation layer 224 may expose at least portions of the second test pads 240 in the underlying second wiring layer 222.

For example, the first and third bonding pads 130 and 230 may include copper. The first and second test pads 140 and 240 may include copper. The first bonding pad 130 may have a third thickness T3, and the first test pad 140 may have a fourth thickness T4 greater than the third thickness T3. The first bonding pad 130 has a third height H3 from the first surface 112 of the first substrate 110, and the first test pad 140 may have a fourth height H4 from the first surface 112 of the first substrate 110. The third height H3 may be greater than the fourth height H4.

In example embodiments, the first passivation layer 124 of the first semiconductor chip 100 and the second passivation layer 224 of the second semiconductor chip 200 may be directly bonded to each other. The first bonding pad 130 of the first semiconductor chip 100 and the third bonding pad 230 of the second semiconductor chip 200 may be bonded to each other by copper-copper hybrid bonding.

The first and second test pads 140 and 240 may include copper (Cu) and may have a relatively large thickness. The first and second test pads 140 and 240 may be provided on the first and second wiring layers 122 and 222 under the first and second passivation layers 124 and 224, respectively. Even through the first and second test pads 140 and 240 are inflated in the thermal compression process, the first test pad 140 and the second test pad 240 may not be bonded to each other. The first test pad 140 and the second test pad 240 may be spaced apart from each other. For example, an empty space S may be formed between the first and second test pads 140 and 240.

Hereinafter, a method of manufacturing the semiconductor package of FIG. 21 will be described.

Figure 23:
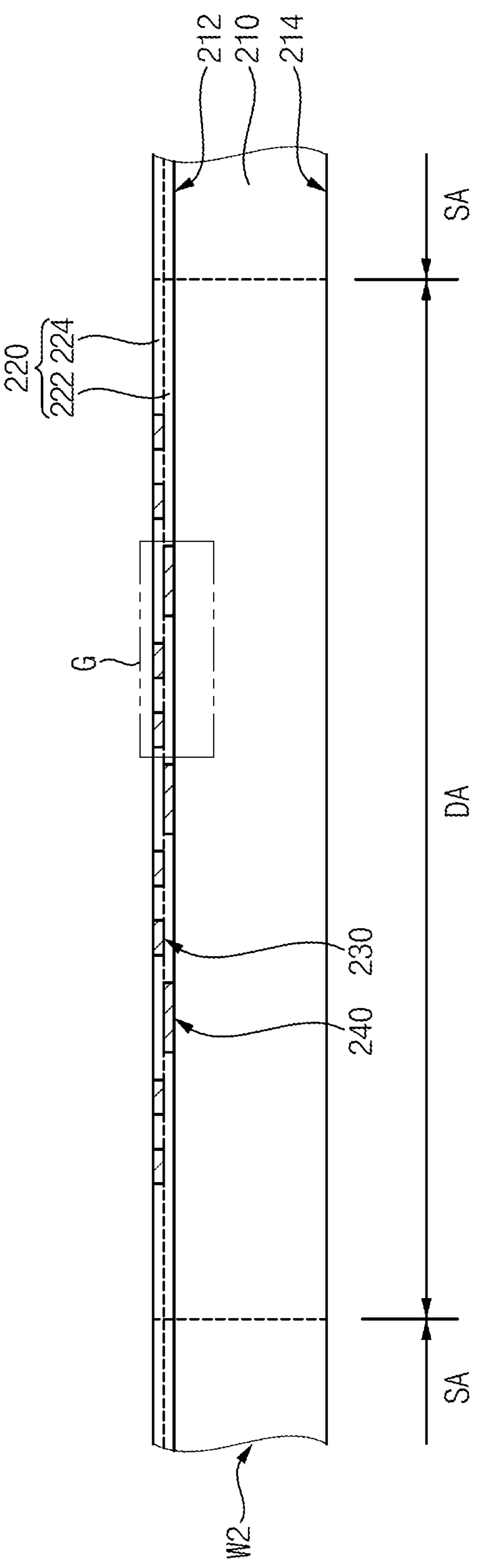
Figure 24:
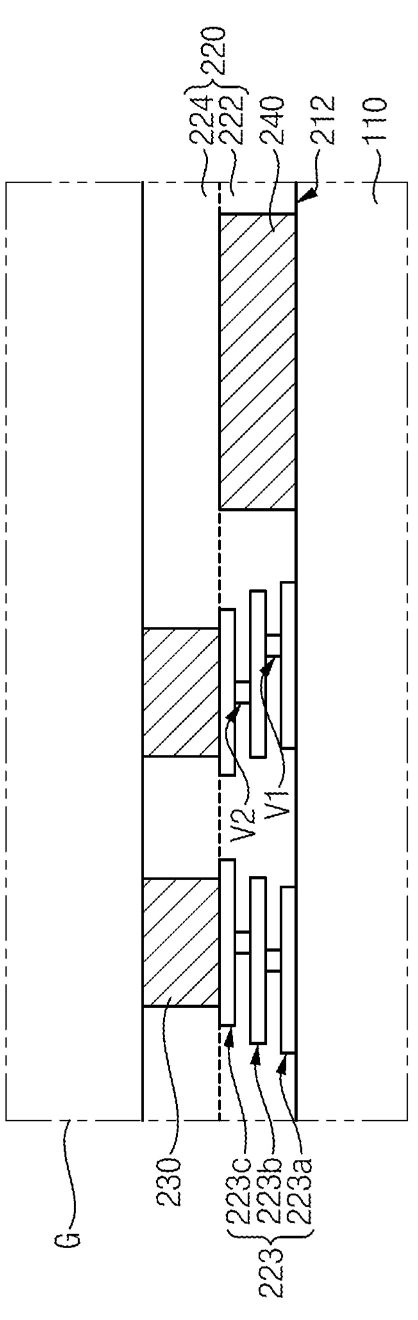
Figure 27:
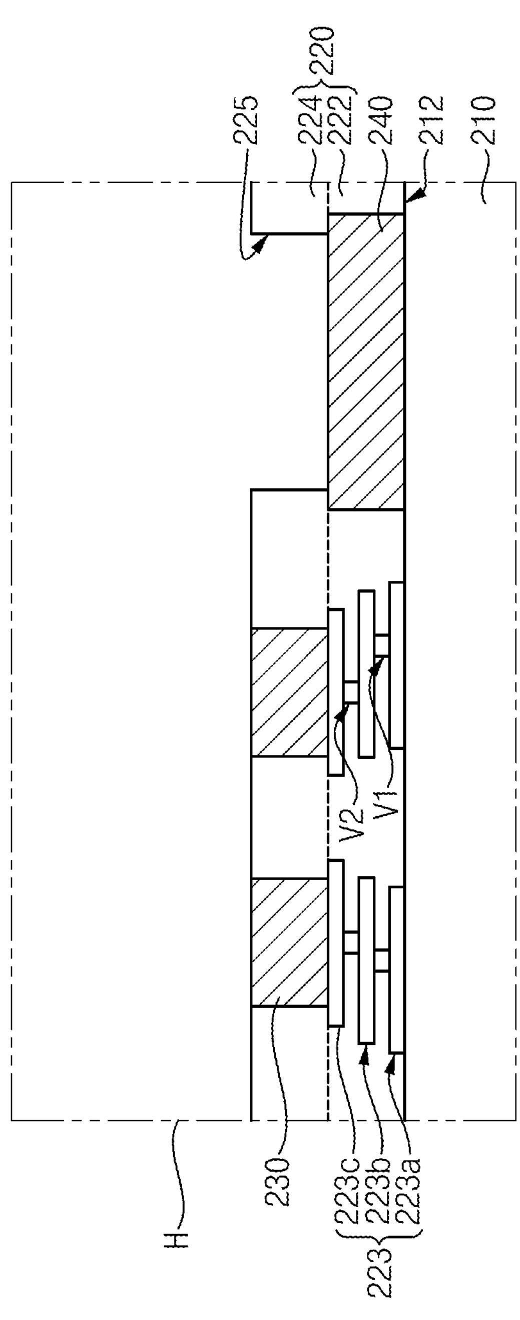
Figure 28:
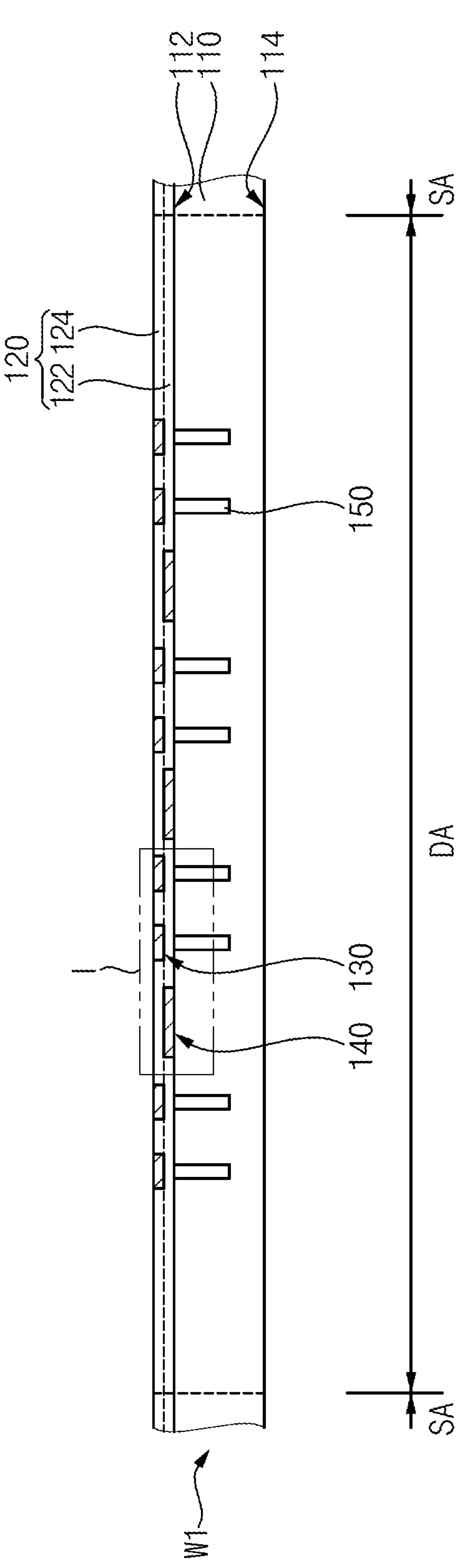
Figure 29:
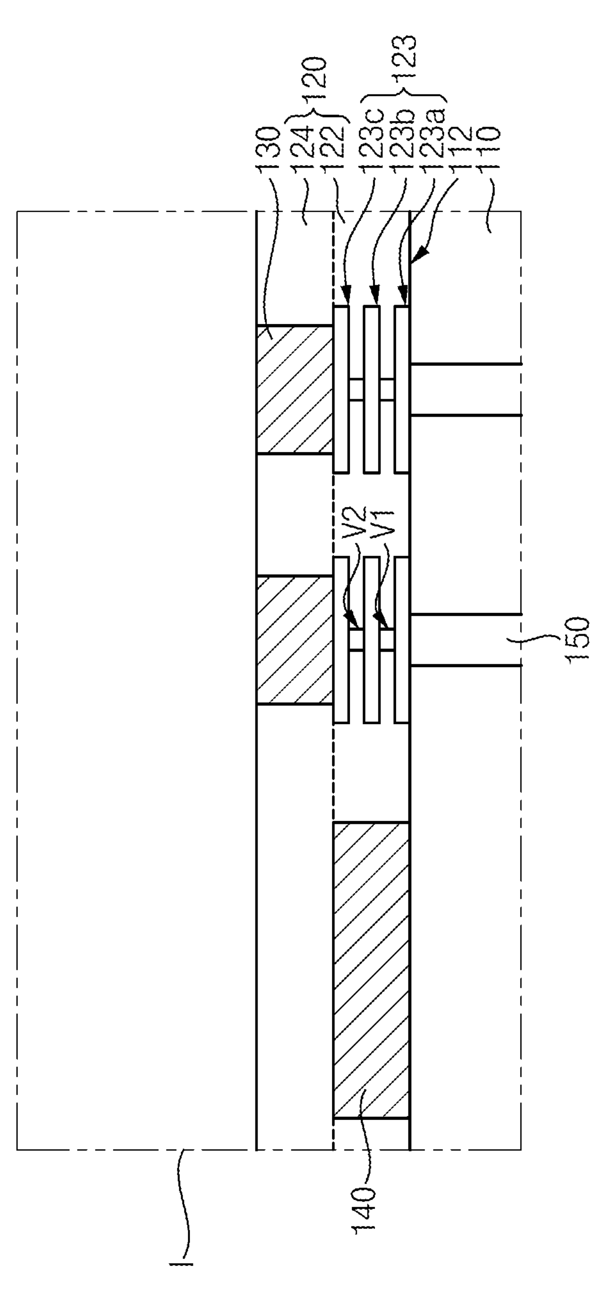
Figure 31:
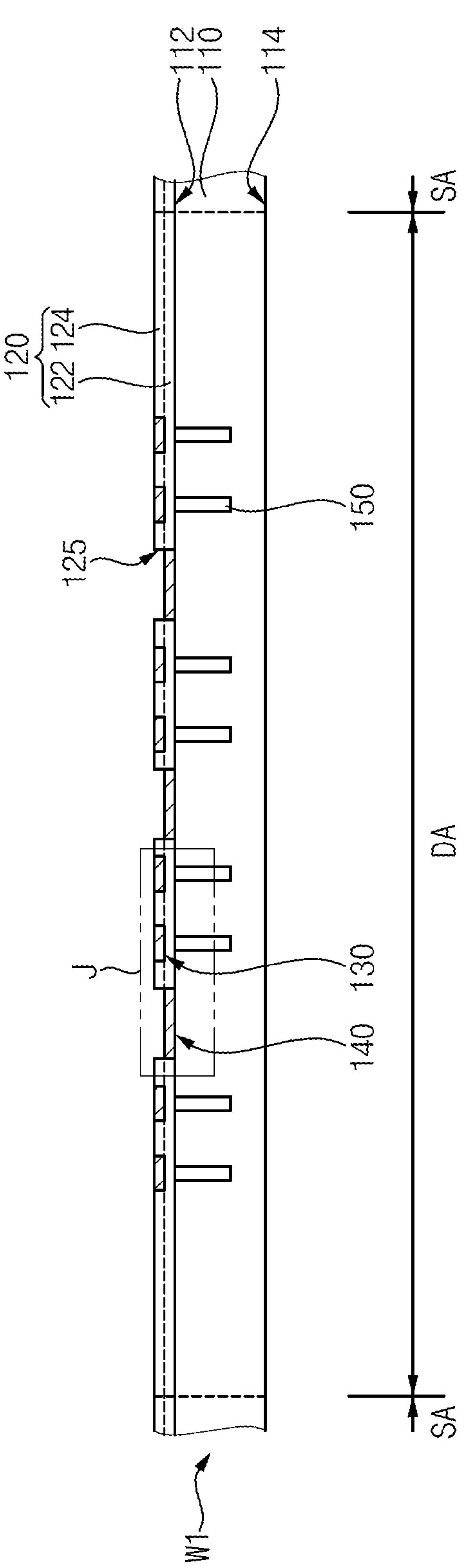
Figure 32:
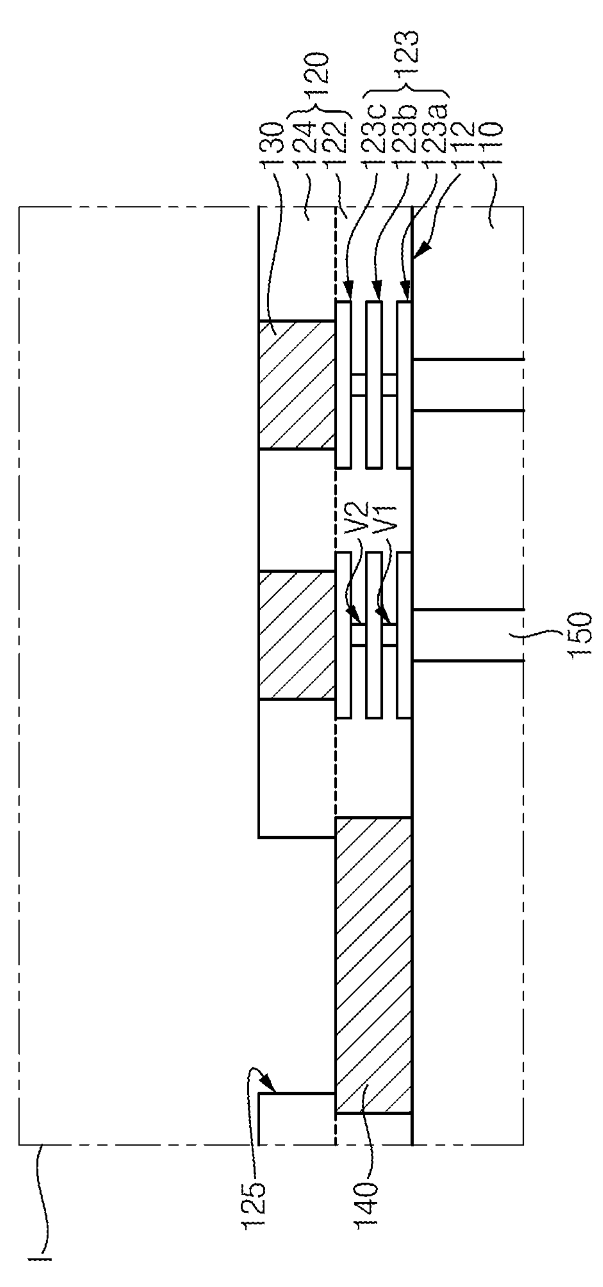
Figure 33:
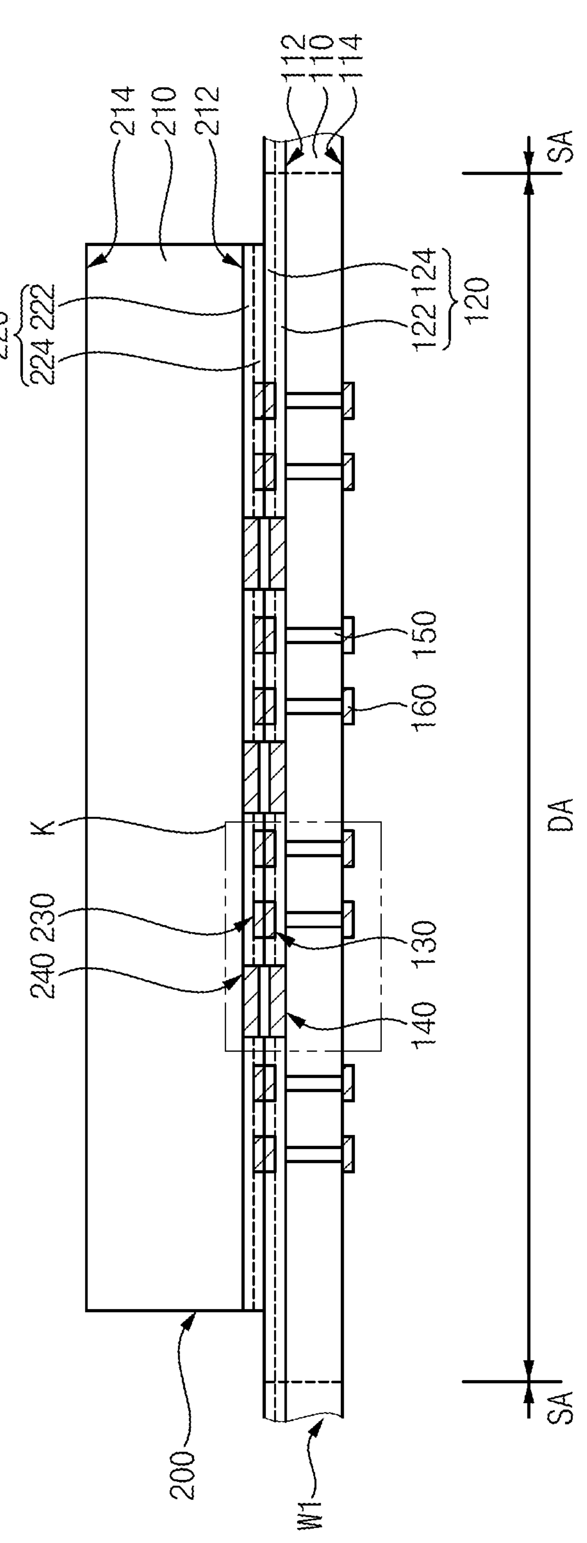
Figure 34:
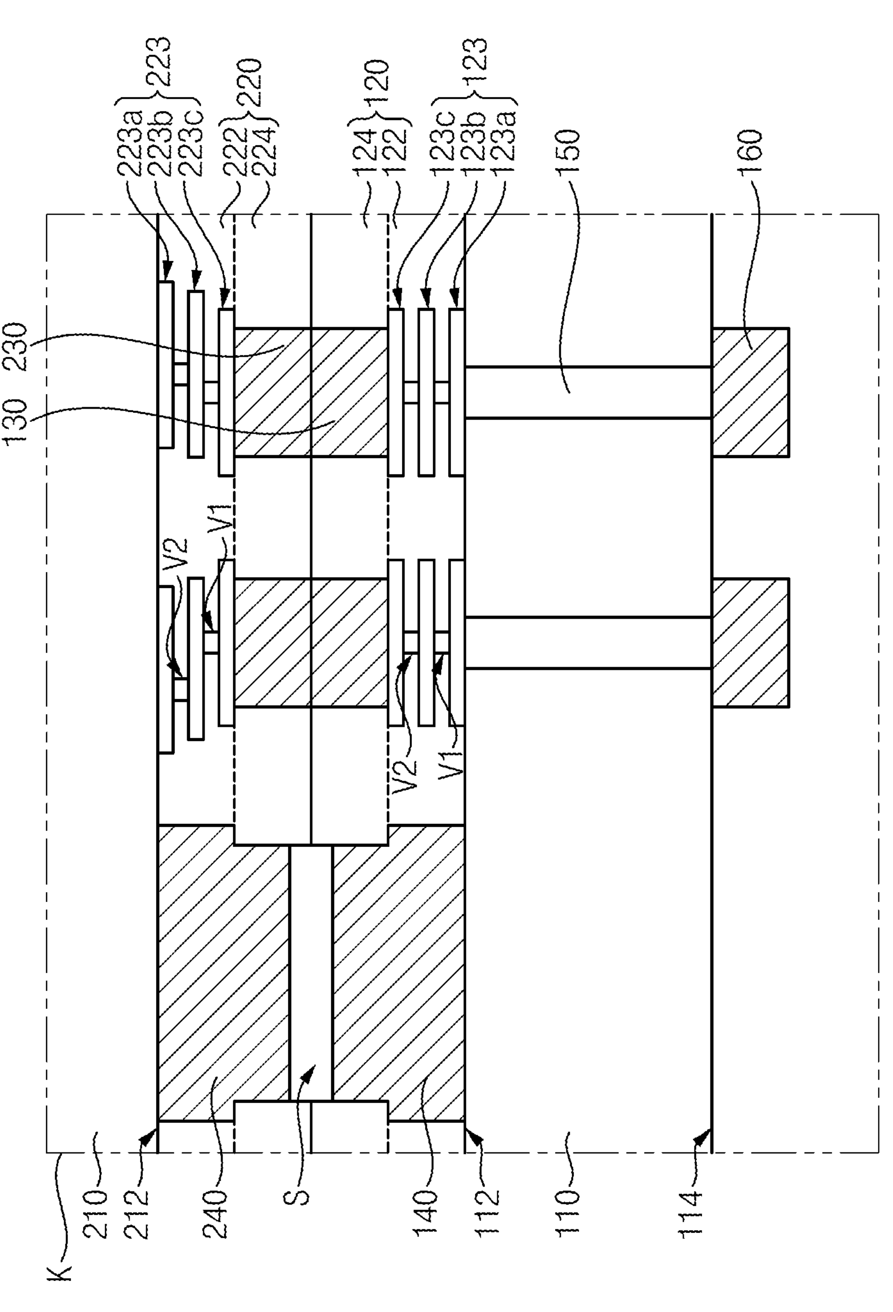

FIGS. 23 to 34 are views illustrating a method of manufacturing a semiconductor package in accordance with example embodiments. FIGS. 24 and 25 are enlarged cross-sectional views illustrating portion 'G' in FIG. 23. FIG. 27 is an enlarged cross-sectional view illustrating portion 'H' in FIG. 26. FIGS. 29 and 30 are enlarged cross-sectional views illustrating portion 'I' in FIG. 28. FIG. 32 is an enlarged cross-sectional view illustrating portion 'J' in FIG. 31. FIG. 34 is an enlarged cross-sectional view illustrating portion 'K' in FIG. 33.

Referring to FIGS. 23 and 24, first, a second wafer W2 including a plurality of second semiconductor chips (dies) formed therein may be prepared.

In example embodiments, the second wafer W2 may include a second substrate 210 and a second front insulating layer 220 having third bonding pads 230 formed on an outer surface thereof. The second front insulating layer 220 may be formed on a first surface 212 of the second substrate 210, that is, the front side surface. The second front insulating layer 220 may include a second wiring layer 222 and a second passivation layer 224. In addition, the third bonding pads 230 may be provided on an outermost insulating layer of the second front insulating layer 220.

Second test pads 240 may be formed in the second wiring layer 222. The second passivation layer 224 may be provided on the second wiring layer 222 and may cover or overlap the second test pads 240. The second test pad 240 may have a thickness greater than a thickness of a metal wiring of the second wiring layer 222. The thickness of the second test pad 240 may be equal to or smaller than a thickness of the second wiring layer 222. For example, the second test pad 240 may include copper (Cu).

Referring to FIGS. 25 to 27, the second passivation layer 224 may be patterned to form openings 225 that expose at least portions of the second test pads 240 in the second wiring layer 222.

As illustrated in FIG. 25, a third photoresist pattern 40 having a third opening 42 that exposes a test pad region may be formed on the second passivation layer 224, and the second passivation layer 224 may be etched using the third photoresist pattern 40 as an etching mask to form the opening 225 that exposes the second test pad 240 in the test pad region.

As illustrated in FIGS. 26 and 27, the third photoresist pattern 40 may be removed from the second substrate 210. Accordingly, the second passivation layer 224 may expose at least portions of the second test pads 240 in the underlying second wiring layer 222.

Then, an inspection process such as an electrical die sorting (EDS) process is performed using the second test pads 240, and then, processes the same as or similar to the processes described with reference to FIG. 11 may be performed to cut the second wafer W2 along a scribe lane region SA to form an individualized second semiconductor chip 200 (see FIG. 33).

Referring to FIGS. 28 and 29, a first wafer W1 including a plurality of first semiconductor chips (dies) formed therein may be prepared.

In example embodiments, the first wafer W1 may include a first substrate 110, a first front insulating layer 120 having first bonding pads 130 on an outer surface thereof, and a plurality of through electrodes 150 at least partially penetrating the first substrate 110. The first front insulating layer 120 may be formed on a first surface 112 of the first substrate 110, that is, the front side surface. The first front insulating layer 120 may include a first wiring layer 122 and a first passivation layer 124. In addition, the first bonding pads 130 may be provided on an outermost insulating layer of the first front insulating layer 120.

First test pads 140 may be formed in the first wiring layer 122. The first passivation layer 124 may be provided on the first wiring layer 122 and may cover or overlap the first test pads 140. The first test pad 140 may have a thickness greater than a thickness of a metal wiring of the first wiring layer 122. The thickness of the first test pad 140 may be equal to or smaller than a thickness of the first wiring layer 122. For example, the first test pad 140 may include copper (Cu).

Referring to FIGS. 30 to 32, the first passivation layer 124 may be patterned to form openings 125 that expose at least portions of the first test pads 140 in the first wiring layer 122.

As illustrated in FIG. 30, a fourth photoresist pattern 50 having a fourth opening 52 that exposes a test pad region may be formed on the first passivation layer 124, and the first passivation layer 124 may be etched using the fourth photoresist pattern 50 as an etching mask to form the opening 125 that exposes the first test pad 140 in the test pad region.

As illustrated in FIGS. 31 and 32, the fourth photoresist pattern 50 may be removed from the first substrate 110. Accordingly, the first passivation layer 124 may expose at least portions of the first test pads 140 in the underlying first wiring layer 122.

Then, an inspection process such as an electrical die sorting (EDS) process is performed using the first test pads 140, and then, processes the same as or similar to the processes described with reference to FIG. 15 may be performed form second bonding pads 160 (see FIG. 33) on a second surface of the first substrate 110 to be electrically connected to the through electrodes 150.

Referring to FIGS. 33 and 34, processes the same as or similar to the processes described with reference to FIGS. 16 and 17 may be performed to attach a plurality of the second semiconductor chips 200 on the first wafer W1 (die to wafer hybrid bonding process).

In example embodiments, the second semiconductor chips 200 may be disposed on the first wafer W1 to correspond to die regions DA. The second semiconductor chip 200 may be arranged such that the first surface 212 of the second substrate 210 faces the first wafer W1.

By a thermal compression process, the second semiconductor chip 200 and the first wafer W1 may be bonded to each other through hybrid bonding. That is, the second front insulating layer 220 on the front surface of the second semiconductor chip 200, that is, the first surface 212 of the second substrate 210 may be directly bonded to the first front insulating layer 120 on the first substrate 110 of the first wafer W1.

The first bonding pad 130 of the first wafer W1 and the third bonding pad 230 of the second semiconductor chip 200 may contact each other. The front surface of the second semiconductor chip 200 and the front surface of the first wafer W1 may be bonded to face each other. When the first wafer W1 and the second semiconductor chip 200 are bonded to each other by the wafer-to-die bonding, the first bonding pad 130 of the first wafer W1 and the third bonding pads 230 of the second semiconductor chip 200 may be bonded to each other by copper-copper hybrid bonding (Cu—Cu hybrid bonding).

The first and second test pads 140 and 240 including copper (Cu) and having relatively large thicknesses may be inflated by the thermal compression process, and thus, the first and second test pads 140 and 240 may at least partially fill the openings 125 and/or 225 of FIG. 7 and/or FIG. 32 the first and second passivation layers 124 and 224 respectively. The first test pad 140 and the second test pad 240 may not be bonded to each other. The first test pad 140 and the second test pad 240 may be spaced apart from each other. For example, an empty space S may be formed between the first and second test pads 140 and 240.

Then, processes the same as or similar to the processed described with reference to FIGS. 18 to 20 may be performed to form a stack package in which the second semiconductor chip 200 is stacked on the first semiconductor chip 100, and the stack package may be mounted on the package substrate 300.

Then, an underfill member 500 may be underfilled between the first semiconductor chip 100 and a package substrate 300, and external connection members 600 may be formed on outer connection pads 330 on a lower surface 304 of the package substrate 300 to complete the semiconductor package 11 (see FIG. 21) of FIG. 21.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:

a first semiconductor chip; and a second semiconductor chip on the first semiconductor chip, wherein the first semiconductor chip includes a first substrate, a plurality of through electrodes that penetrate the first substrate, a first wiring layer on a front side surface of the first substrate, first bonding pads on the first wiring layer and electrically connected to respective ones of the plurality of through electrodes, a first test pad on the first wiring layer, and a first passivation layer on the first wiring layer and that exposes at least portions of the first bonding pads and the first test pad, wherein at least one first bonding pad of the first bonding pads and the first test pad are disposed adjacent to each other in the first passivation layer;

wherein the second semiconductor chip includes a second substrate, a second wiring layer on a front side surface of the second substrate, third bonding pads on the second wiring layer, a second test pad on the second wiring layer, and a second passivation layer on the second wiring layer and that exposes at least portions of the third bonding pads and the second test pad, wherein the first bonding pads and respective ones of the third bonding pads are directly bonded to each other, and wherein the first passivation layer and the second passivation layer are directly bonded to each other.

2. The semiconductor package of claim 1, wherein a distance of the first test pad from the front side surface of the first substrate is less than a distance of a first one of the first bonding pads from the front side surface of the first substrate.

3. The semiconductor package of claim 1, wherein the first and second test pads include aluminum or copper.

4. The semiconductor package of claim 1, wherein the first and second test pads include aluminum, and the first and second test pads are on the first and second wiring layers respectively.

5. The semiconductor package of claim 4, wherein the first and second test pads have a first thickness, and the first and third bonding pads have a second thickness greater than the first thickness.

6. The semiconductor package of claim 1, wherein the first and second test pads include copper, and the first and second test pads are provided in the first and second wiring layers respectively.

7. The semiconductor package of claim 1, wherein the first and second test pads have a first diameter, and the first and third bonding pads have a second diameter smaller than the first diameter.

8. The semiconductor package of claim 1, wherein the first and second passivation layers include silicon oxide, silicon nitride, or silicon carbon nitride.

9. The semiconductor package of claim 1, wherein at least a portion of the first test pad and at least a portion of the second test pad are directly bonded to each other.

10. The semiconductor package of claim 9, wherein the first test pad and the second test pad have a space therebetween that does not overlap the portion of the first test pad and the portion of the second test pad that are directly bonded to each other in a direction perpendicular to the first substrate.

11. A semiconductor package, comprising:

a first semiconductor chip including a first substrate having a first surface and a second surface opposite to the first surface, a plurality of through electrodes that penetrate the first substrate, first bonding pads on the first surface of the first substrate and electrically connected to respective ones of the plurality of through electrodes, a first test pad on the first surface of the first substrate, and a first passivation layer on the first surface of the first substrate and that exposes at least portions of the first bonding pads and the first test pad; and a second semiconductor chip on the first surface of the first semiconductor chip, the second semiconductor chip including a second substrate having a third surface and a fourth surface opposite to the third surface, third bonding pads on the third surface of the second substrate, a second test pad on the third surface of the second substrate, and a second passivation layer on the third surface of the second substrate and that exposes at least portions of the third bonding pads and the second test pad, wherein at least one first bonding pad of the first bonding pads and the first test pad are disposed adjacent to each other in the first passivation layer;

wherein the first bonding pads and respective ones of the third bonding pads are directly bonded to each other, wherein the first passivation layer and the second passivation layer are directly bonded to each other, and wherein the first and second test pads have a first diameter, and the first and third bonding pads have a second diameter that is smaller than the first diameter.

12. The semiconductor package of claim 11, wherein the first and second test pads include aluminum or copper.

13. The semiconductor package of claim 11, wherein the first and second test pads include aluminum, and wherein the first and second test pads are in the first and second passivation layers respectively.

14. The semiconductor package of claim 13, wherein the first and second test pads have a first thickness, and the first and third bonding pads have a second thickness greater than the first thickness.

15. The semiconductor package of claim 11, wherein the first and second test pads include copper, and the first and second test pads are in first and second wiring layers under the first and second passivation layers respectively.

16. The semiconductor package of claim 11, wherein the first and second passivation layers include silicon oxide, silicon nitride, or silicon carbon nitride.

17. The semiconductor package of claim 11, wherein at least a portion of the first test pad and at least a portion of the second test pad are directly bonded to each other.

18. The semiconductor package of claim 17, wherein the first test pad and the second test pad have a space therebetween that does not overlap the portion of the first test pad and the portion of the second test pad that are directly bonded to each other in a direction perpendicular to the first substrate.

19. The semiconductor package of claim 11, wherein the first test pad is electrically connected to a respective one of plurality of through electrodes, and the second test pad is electrically connected to a respective one of the third bonding pads.

20. A semiconductor package, comprising:

a package substrate;

a first semiconductor chip including a first substrate having a first surface and a second surface opposite to the first surface, a plurality of through electrodes that penetrate the first substrate, first bonding pads on the first surface of the first substrate and electrically connected to respective ones of the plurality of through electrodes, second bonding pads on the second surface and electrically connected to respective ones of the plurality of through electrodes, a first test pad on the first surface of the first substrate, and a first passivation layer on the first surface of the first substrate and that exposes at least portions of the first bonding pads and the first test pad, wherein the first semiconductor chip is on the package substrate with conductive bumps therebetween that are on the second bonding pads; and a second semiconductor chip including a second substrate having a third surface and a fourth surface opposite to the third surface, third bonding pads on the third surface of the second substrate, a second test pad on the third surface of the second substrate and a second passivation layer on the third surface of the second substrate and that exposes at least portions of the third bonding pads and the second test pad, wherein the second semiconductor chip is on the first semiconductor chip such that the third surface of the second semiconductor chip faces the first surface of the first semiconductor chip, wherein at least one first bonding pad of the first bonding pads and the first test pad are disposed adjacent to each other in the first passivation layer;

wherein the first bonding pads and respective ones of the third bonding pads are directly bonded to each other, and wherein the first passivation layer and the second passivation layer are directly bonded to each other.

* * * * *